United States Patent
Hwang et al.

(10) Patent No.: US 7,436,806 B2
(45) Date of Patent: Oct. 14, 2008

(54) APPARATUS AND METHOD FOR SYMBOL MAPPING TFCI BITS FOR A HARD SPLIT MODE IN A CDMA MOBILE COMMUNICATION SYSTEM

(75) Inventors: Sung-Oh Hwang, Yongin-shi (KR); Kook-Heui Lee, Songnam-shi (KR); Jae-Yoel Kim, Kunpo-shi (KR); Sang-Hwan Park, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 983 days.

(21) Appl. No.: 10/190,645

(22) Filed: Jul. 8, 2002

(65) Prior Publication Data
US 2003/0072290 A1 Apr. 17, 2003

(30) Foreign Application Priority Data
Jul. 9, 2001 (KR) .............................. 2001-44673
Aug. 25, 2001 (KR) .............................. 2001-51605
Aug. 29, 2001 (KR) .............................. 2001-52596

(51) Int. Cl.
*H04B 7/216* (2006.01)
(52) U.S. Cl. ........................ 370/335; 370/342
(58) Field of Classification Search ............... None
See application file for complete search history.

(56) References Cited

U.S. PATENT DOCUMENTS 6,781,970 B1 * 8/2004 Ovesjo et al. ............... 370/328
6,898,429 B1 * 5/2005 Vialen et al. ............. 455/432.1
6,904,290 B1 * 6/2005 Palenius ...................... 455/522
6,944,178 B1 * 9/2005 Charriere et al. ............ 370/444
7,068,618 B2 * 6/2006 Zeira et al. .................. 370/321
2005/0105502 A1 * 5/2005 Kim et al. .................... 370/342
2006/0171416 A1 * 8/2006 Seidel et al. ................. 370/473

FOREIGN PATENT DOCUMENTS

EP 0 991 218 4/2000

(Continued)

OTHER PUBLICATIONS

F. J. Macwilliams, N.J.A. Sloane, North-Holland, "The Theory of Error-Correcting Codes", Linear Codes, Ch. 1, §§2-3. pp. 6-15.

(Continued)

*Primary Examiner*—Andrew C. Lee
(74) *Attorney, Agent, or Firm*—The Farrell Law Firm

(57) ABSTRACT

A method for mapping first coded TFCI symbols and second coded TFCI symbols to a radio frame in a transmission apparatus of a mobile communication system for encoding k first TFCI bits and (10–k) second TFCI bits, a sum of the first coded TFCI symbols and the second coded TFCI symbols being 32. The method comprises multiplexing the coded symbols such that the first coded TFCI symbols and the second coded TFCI symbols are uniformly distributed according to a transmission mode and a data rate of the radio frame, and outputting 32 coded symbols; and mapping the 32 multiplexed coded symbols to the radio frame to satisfy the number of the coded symbols that can be mapped to one radio frame, determined according to the transmission mode and the data rate of the radio frame.

22 Claims, 20 Drawing Sheets

FOREIGN PATENT DOCUMENTS

| | | |
|---|---|---|
| EP | 1 009 174 | 6/2000 |
| EP | 1 041 850 | 10/2000 |
| EP | 1 069 798 | 1/2001 |
| EP | 1 089 587 | 4/2001 |
| EP | 1 102 440 | 5/2001 |
| EP | 1 104 130 | 5/2001 |
| WO | WO 01/03366 | 1/2001 |
| WO | WO 01/17283 | 3/2001 |

OTHER PUBLICATIONS

Swedish Office Action dated Oct. 22, 2003 issued in a counterpart application, namely, Appln. No. 0202150-9.

$3^{rd}$ Generation Partnership Project (3GPP); Technical Specification Group (TSG), Radio Access Network (RAN); Working Group 1 (WGI); Multiplexing and Channel Coding (FDD), TSG-RAN Meeting No. 5, Oct. 1999.

Samsung Electronics Co., Ltd.: "TFCI Coding Scheme for the Variable Hard Split Mode (Revision of R1-01-0731)", Jun. 26-28, 2001.

* cited by examiner

APPARATUS AND METHOD FOR SYMBOL MAPPING TFCI BITS FOR A HARD SPLIT MODE IN A CDMA MOBILE COMMUNICATION SYSTEM

PRIORITY

This application claims priority to an application entitled "Apparatus and Method for Symbol Mapping TFCI Bits for a Hard Split Mode in a CDMA Mobile Communication System" filed in the Korean Industrial Property Office on Jul. 9, 2001 and assigned Serial No. 2001-44673, an application entitled "Apparatus and Method for Symbol Mapping TFCI Bits for a Hard Split Mode in a CDMA Mobile Communication System" filed in the Korean Industrial Property Office on Aug. 25, 2001 and assigned Ser. No. 2001-51605, and an application entitled "Apparatus and Method for Symbol Mapping TFCI Bits for a Hard Split Mode in a CDMA Mobile Communication System" filed in the Korean Industrial Property Office on Aug. 29, 2001 and assigned Ser. No. 2001-52596, the contents of all of which are hereby incorporated by reference.

BACKGROUND OF THE INVENTION

1. Field of the Invention

The present invention relates generally to a transmission apparatus and method for a hard split mode in a CDMA mobile communication system, and in particular, to a mapping apparatus and method for transmitting TFCI (Transport Format Combination Indicator) bits.

2. Description of the Related Art

In general, a downlink-shared channel (DSCH) is shared by a plurality of users on a time-division basis. The DSCH is established in association with a dedicated channel (DCH) for every user. The DCH is transmitted over a dedicated physical channel (DPCH), and the DPCH is constructed by combining a dedicated physical control channel (DPCCH) and a dedicated physical data channel (DPDCH) on a time-division basis.

The DSCH is transmitted over a physical downlink shared channel (PDSCH), and channel control information for the PDSCH is transmitted over DPCCH in the DPCH. The control information transmitted over the DPCCH includes information on (i) TPC (Transmitted Power Control command) for controlling uplink transmission power from a UE (User Equipment), (ii) Pilot field used for channel variation estimation, transmission power measurement, and slot synchronization acquisition from a Node B to a UE, and (iii) TFCI (Transport Format Combination Indicator). Of this information, the TPC and the Pilot are used as physical control information for the PDSCH and the DPCH, and the TFCI is used to indicate information characteristics (e.g., information transfer rate, and combination of different information, i.e., combination of voice information and packet information) of the data transmitted over the DSCH and the DPDCH.

As stated above, the TFCI, the control information indicating information characteristics of the data transmitted over the physical channels DSCH and DPDCH, has a 10-bit length and is encoded into 32 bits. That is, information on an amount of data is expressed with 10 bits, and the 10-bit information is encoded into 32 bits to be transmitted over the physical channel.

The TFCI is transmitted over the physical channel in the following method specified in the 3GPP ($3^{rd}$ Generation Partnership Project) Technical Specification 25.212 for the UMTS (Universal Mobile Telecommunication System).

$a_k = k^{th}$ information bit of transport combination information ($0 \leq k \leq 9$)

$b_l = l^{th}$ coded bit of transport combination information ($0 \leq l \leq 31$)

$d_m = m^{th}$ transmitted coded bit of transport combination information

The $a_k$ is 10-bit information indicating rate, type, and combination of the data transmitted over the DPDCH, the $b_l$ is comprised of 32 coded bits obtained by encoding the $a_k$, and the $d_m$ is a transmitted coded bit where the $b_l$ is transmitted over the DPCCH. Here, the value m is variable according to conditions.

Conditions for determining the number of $d_m$ bits are determined based on a transmission mode of the DPCCH and a data rate of the DPCH. The transmission mode of the DPCCH includes a normal transmission mode and a compressed transmission mode. The compressed transmission mode is used when a UE having one RF transceiver intends to measure at another frequency band. An operation in the compressed transmission mode temporarily suspends transmission at the current frequency band enabling the UE to measure at another frequency band. Data to be transmitted in the transmission suspended period is compressed immediately before and after the transmission suspended period.

The "data rate of the DPCH", one of the conditions for determining the number of $d_m$ bits, refers to a physical data rate of the DPCH and is determined according to a spreading factor (SF) of data. The SF ranges from 4 to 512 and the data rate ranges from 15 Kbps to 1920 Kbps. As the SF becomes higher, the data rate becomes lower. The reason that the number of $d_m$ bits is determined according to the data rate of the DPCH is because the size (or length) of the TFCI field transmitting TFCI bits of the DPCCH is variable according to the data rate of the DPCH.

The number of $d_m$ bits transmitted for each of the conditions for determining $d_m$ is calculated as follows.

A1. Normal Transmission Mode, Data Rate of DPCH Being Lower Than 60 Kbps

In a condition A1 for determining the number of $d_m$ bits, the number of $d_m$ bits becomes 30. In the 3GPP standard, a basic transmission unit of the physical channel is a radio frame. The radio frame has a length of 10 ms and is comprised of 15 time slots. Each time slot has fields for transmitting TFCI. In condition A1, each time slot has 2 TFCI transmission fields, so the number of TFCI transmission code bits $d_m$ that can be transmitted for one radio frame becomes 30. Therefore, although the number of the coded bits $b_l$ based on the information bit $a_k$ becomes 32, the last two transport combination information bits $b_{30}$ and $d_{31}$ are not transmitted due to a limitation in the number of the TFCI fields actually transmitted.

A2. Normal Transmission Mode, Data Rate of DPCH Being Higher Than 60 Kbps

In a condition A2 for determining the number of $d_m$ bits, a length of the TFCI field in the time slot becomes 8 bits, and the total number of $d_m$ that can be transmitted over the DPCCH for one radio frame becomes 120. When the total number of $d_m$ is 120, $b_l$ is repeatedly transmitted as follows.

$d_0(b_0), \ldots, d_{31}(b_{31}), d_{32}(b_0), \ldots, d_{63}(b_{31}), \ldots, d_{96}(b_0), \ldots, d_{119}(b_{23})$ In condition A2, $0^{th}$ to $23^{rd}$ $b_l$ bits are repeated 4 times, and $24^{th}$ to $31^{st}$ $b_l$ bits are repeated 3 times for transmission.

A3. Compressed Transmission Mode, Data Rate of DPCH Being Lower Than 60 Kbps or Equal to 120 Kbps In a condition A3 for determining the number of $d_m$ bits, a length of the TFCI field in the time slot becomes 4 bits, and the number of TFCIs that can be transmitted for one radio frame is variable according to the number of time slots used in the compressed transmission mode. In the compressed transmission mode, the number of transmission-suspended time slots ranges from a minimum of 1 to a maximum of 7, and the number of $d_m$ bits is between 32 and 56. The number of the transmitted coded bits $d_m$ is limited to a maximum of 32, thereby to transmit all of $0^{th}$ to $31^{st}$ $b_l$ bits at the changed $d_m$, and not transmit the $b_l$ bits at the other $d_m$.

A4. Compressed transmission mode, data rate of DPCH being higher than 120 Kbps or equal to 60 Kbps In a condition A4 for determining the number of $d_m$ bits, a length of the TFCI field in the time slot becomes 16 bits, and the number of TFCIs that can be transmitted for one radio frame is variable according to the number of time slots used in the compressed transmission mode. In the compressed transmission mode, the number of transmission-suspended time slots ranges from a minimum of 1 to a maximum of 7, and the number of $d_m$ bits ranges from 128 to 244. The number of the transmitted coded bits $d_m$ is limited to a maximum of 128, thereby to repeatedly transmit $0^{th}$ to $31^{st}$ $b_l$ bits 4 times at the changed $d_m$, and not transmit the $b_l$ bits at the other $d_m$.

In the compressed transmission mode of conditions A3 and A4, the $d_m$ bits are arranged in a period as far away from the transmission suspended period as possible to maximize reliability of transmitting the $d_m$ bits.

The conditions A1, A2, A3, and A4 are used when the TFCI indicates the transport combination and type of the DPCH. A method of dividing the TFCI into TFCI for DSCH and TFCI for DPCH during transmission can be divided into two separate methods.

A first method is for a hard split mode (HSM), and a second method is for a logical split mode (LSM).

The TFCI for DCH will be referred to as TFCI(field 1) or a first TFCI, and the TFCI for DSCH will be referred to as TFCI(field 2) or a second TFCI.

In the LSM method, the TFCI(field 1) and the TFCI(field 2), as one TFCI, are encoded with a (32,10) sub-code of the second order Reed-Muller code. The TFCI(field 1) and the TFCI(field 2) express 10-bit TFCI information in various ratios, and the 10 information bits are encoded with one block code, i.e., (32,10) sub-code of the second order Reed-Muller code according to the conditions A1, A2, A3, and A4, before being transmitted. The ratios of the TFCI(field 1) to the TFCI (field 2) include 1:9, 2:8 3:7, 4:6, 5:5, 6:4, 7:3, 8:2, and 9:1. The sum of the first TFCI information bits and the second TFCI information bits may be less than 10. In the LSM, if the sum of the first TFCI information bits and the second TFCI information bits is less than 10, as many 0's as the number of the insufficient bits are inserted. As a result, the first TFCI information bits and the second TFCI information bits can be encoded with a (32,10) Reed-Muller code before being transmitted.

In the HSM method, the TFCI(field 1) and the TFCI(field 2) are fixedly expressed with 5 bits, respectively, and each information is output using a (16,5) bi-orthogonal code, and then the 16 bits for the TFCI(field 1) and the TFCI(field 2) are alternately transmitted in accordance with the conditions A1, A2, A3, and A4. When the maximum number of the first TFCI information bits and the maximum number of the second TFCI information bits are both limited to 5, if the number of the first TFCI information bits or the second TFCI information bits exceeds 5, it is not possible to use the HSM method. Therefore, if the number of the first TFCI information bits or the second TFCI information bits is less than 5, as many 0's as the number of empty bits are inserted before being encoded using a (16,5) bi-orthogonal code.

FIG. 1 illustrates a structure of a transmitter based on the conventional HSM method. Referring to FIG. 1, a (16,5) bi-orthogonal encoder 100 encodes a 5-bit TFCI(field 1) for the DCH into 16 coded symbols, and provides the 16 coded symbols to a multiplexer 110. At the same time, a (16,5) bi-orthogonal encoder 105 encodes a 5-bit TFCI(field 2) for the DSCH into 16 coded symbols, and provides the 16 coded symbols to the multiplexer 110. The multiplexer 110 then time-multiplexes the 16 coded symbols from the encoder 100 and the 16 coded symbols from the encoder 105, and outputs 32 symbols after arrangement. A multiplexer 120 time-multiplexes the 32 symbols output from the multiplexer 110 and other signals, and provides its output to a spreader 130. The spreader 130 spreads the output signal of the multiplexer 120 with a spreading code provided from a spreading code generator 135. A scrambler 140 scrambles the spread signal with a scrambling code provided from a scrambling code generator 145.

If a UE is located in a soft handover region, the LSM method is under many restrictions for the following reasons. For convenience of explanation, a brief description of a 3GPP wireless transmission network will be given. A RAN (Radio Access Network) is comprised of a RNC (Radio Network Controller), a Node B controlled by the RNC, and a UE (User Equipment). The RNC controls the Node B, the Node B serves as a base station, and the UE serves as a terminal. The RNC can be divided into an SRNC (Serving Radio Network Controller) and a CRNC (Control Radio Network Controller) according to the relationships with the UE. The SRNC, an RNC where the UE is registered, processes data to be transmitted to and received from the UE, and controls the UE. The CRNC, an RNC where the UE is currently connected, connects the UE to the SRNC.

When Node Bs in communication with the UE belong to different RNCs, the Node Bs not transmitting DSCH cannot recognize a value of the coded TFCI bits for the DSCH, so it is not possible to correctly transmit coded TFCI bits to the UE.

In the above-stated HSM, the TFCI information bits for the DSCH and the TFCI information bits for the DCH are independently encoded, so the UE has no difficulty in decoding received TFCI bits. However, in the current 3GPP HSM, the number of the TFCI bits for the DCH and the number of the TFCI bits for the DSCH are both fixed to 5 bits to express 32 information bits. Therefore, when more TFCI bits for the DCH or the DSCH are needed, the HSM cannot be used.

SUMMARY OF THE INVENTION

It is, therefore, an object of the present invention to provide an apparatus and method for transmitting/receiving TFCI bits in a CDMA mobile communication system.

It is another object of the present invention to provide an apparatus and method for mapping coded TFCI symbols to a physical channel in a CDMA mobile communication system.

It is further another object of the present invention to provide an apparatus and method for mapping coded TFCI symbols for DCH and coded TFCI symbols for DSCH, separated in a specific ratio, to a physical channel in a CDMA mobile communication system.

It is yet another object of the present invention to provide an apparatus and method for receiving coded TFCI symbols mapped to a physical channel before being transmitted in a CDMA mobile communication system.

It is still another object of the present invention to provide an apparatus and method for receiving coded TFCI symbols for DCH and coded TFCI symbols for DSCH, separated in a specific ratio, mapped to a physical channel before being transmitted in a CDMA mobile communication system.

In accordance with a first aspect of the present invention, there is provided a method for mapping first coded TFCI symbols and second coded TFCI symbols to a radio frame in a transmission apparatus of a mobile communication system for encoding k first TFCI bits and (10−k) second TFCI bits, a sum of the first coded TFCI symbols and the second coded TFCI symbols being 32. The method comprises multiplexing the coded symbols such that the first coded TFCI symbols and the second coded TFCI symbols are uniformly distributed according to a transmission mode and a data rate of the radio frame, and outputting 32 coded symbols; and mapping the 32 multiplexed coded symbols to the radio frame to satisfy the number of the coded symbols that can be mapped to one radio frame, determined according to the transmission mode and the data rate of the radio frame.

In accordance with a second aspect of the present invention, there is provided an apparatus for transmitting first TFCI bits and second TFCI bits over a radio frame in a transmission apparatus of a mobile communication system. The apparatus comprises at least one encoder for encoding k first TFCI bits at a first coding rate to output (3k+1) first coded TFCI symbols, and encoding (10−k) second TFCI bits at a second coding rate to output (31−3k) second coded TFCI symbols; and a coded symbol arranger for multiplexing the coded symbols such that the first coded TFCI symbols and the second coded TFCI symbols are uniformly distributed according to a transmission mode and a data rate of the radio frame, and outputting the multiplexed coded symbols according to the number of coded symbols that can be transmitted over one radio frame.

In accordance with a third aspect of the present invention, there is provided a method for transmitting first TFCI bits and second TFCI bits over a radio frame in a transmission apparatus of a mobile communication system. The method comprises encoding k first TFCI bits at a first coding rate to output (3k+1) first coded TFCI symbols; encoding (10−k) second TFCI bits at a second coding rate to output (31−3k) second coded TFCI symbols; a coded symbol arranger for multiplexing the coded symbols such that the first coded TFCI symbols and the second coded TFCI symbols are uniformly distributed according to a transmission mode and a data rate of the radio frame; and outputting the multiplexed coded symbols according to the number of coded symbols that can be transmitted over one radio frame.

In accordance with a fourth aspect of the present invention, there is provided an apparatus for decoding k first TFCI bits and (10−k) second TFCI bits in a reception apparatus of a mobile communication system for receiving (3k−1) first coded TFCI symbols for a DCH (Dedicated Channel) and (31−3k) second coded TFCI symbols for a DSCH (Downlink Shared Channel). The apparatus comprises a coded symbol rearranger for separating the first coded TFCI symbols and the second coded TFCI symbols, transmitted over a DPCH (Dedicated Physical Channel), according to a value of the k, for rearrangement; and at least one decoder for decoding the first coded TFCI symbols to output the k first TFCI bits, and decoding the second coded TFCI symbols to output the (10−k) second TFCI bits.

In accordance with a fifth aspect of the present invention, there is provided a method for decoding k first TFCI bits and (10−k) second TFCI bits in a reception apparatus of a mobile communication system for receiving (3k−1) first coded TFCI symbols for a DCH (Dedicated Channel) and (31−3k) second coded TFCI symbols for a DSCH (Downlink Shared Channel). The method comprises separating the first coded TFCI symbols and the second coded TFCI symbols, transmitted over a DPCH (Dedicated Physical Channel), according to a value of the k, for rearrangement; and decoding the first coded TFCI symbols to output the k first TFCI bits; and decoding the second coded TFCI symbols to output the (10−k) second TFCI bits.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
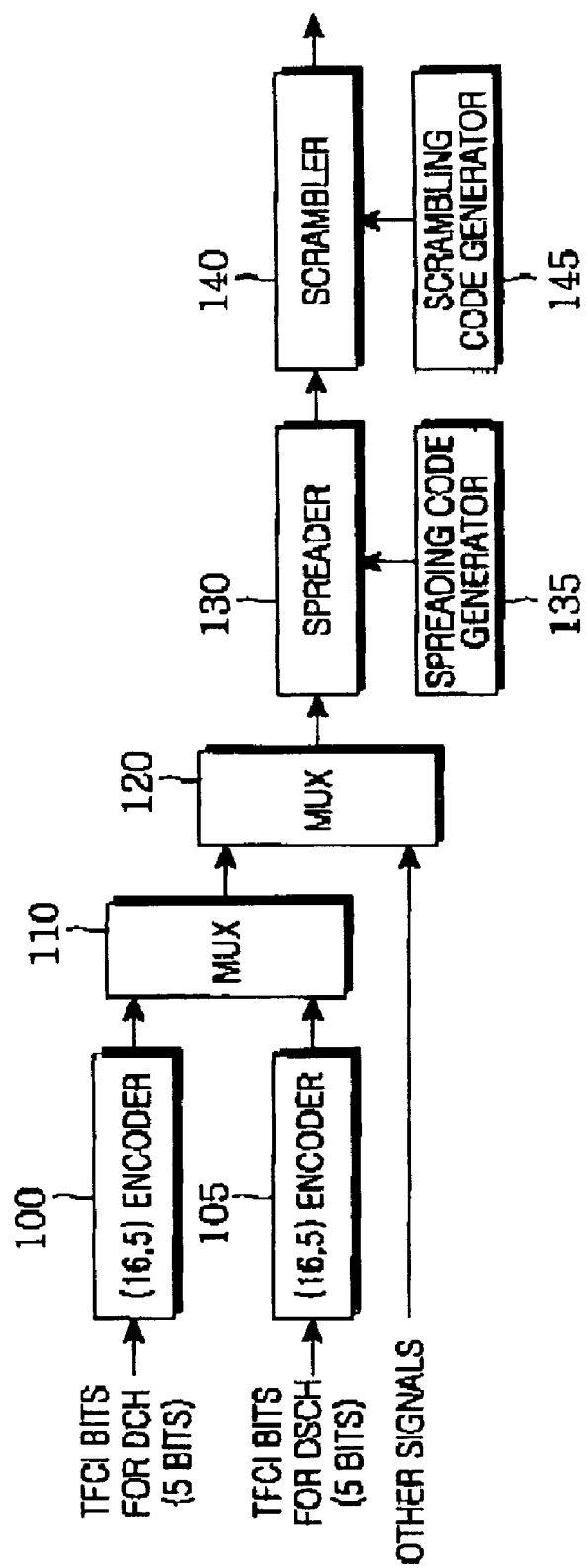
FIG. 1 illustrates a structure of a conventional transmitter based on a hard split mode (HSM)

A preferred embodiment of the present invention will be described herein below with reference to the accompanying drawings. In the following description, well-known functions or constructions are not described in detail since they would obscure the invention in unnecessary detail.

The present invention provides an apparatus and method for dividing a total of 10 input information bits into information bits for DCH and information bits for DSCH in a ratio of 1:9, 2:8, 3:7, 4:6, 5:5, 6:4, 7:3, 8:2, or 9:1 in the HSM method, and then separately encoding the information bits for the DCH and the information bits for the DSCH. If the sum of the number of first TFCI information bits and the number of second TFCI information bits is less than 10, the apparatus and method according to an embodiment of the present invention increases reliability of the first TFCI information bits or the second TFCI information bits before encoding. Alternatively, the apparatus and method increases reliability of both the first TFCI information bits and the second TFCI information bits before encoding.

First, a description of an encoder will be made for when the sum of the first TFCI information bits and the second TFCI information bits is 10.

One radio frame transmits 30, 120, 32, and 128 coded TFCI symbols according to the conditions A1, A2, A3, and A4, respectively. In each case excluding repeated transmission, a basic coding rate is 10/32, and in condition A1, a coding rate becomes 10/30 due to the limited transmission of the physical channel. Therefore, when the TFCI information bits for the DSCH and the TFCI information bits for the DCH are divided in a specific ratio of 1:9, 2:8, 3:7, 4:6, 5:5, 6:4, 7:3, 8:2, or 9:1, it is natural to maintain the coding rate by dividing the coded symbols in the above ratios. Maintaining the coding rate means maintaining a basic coding rate of (32,10). In the HSM, the reason for maintaining a code gain of the differently encoded TFCI for the DSCH and TFCI for the DCH is to maintain a code gain by similarly maintaining the coding rate of (32,10), although the TFCI for the DSCH and the TFCI for the DCH are separately encoded. An example of dividing the coded bits according to the ratio of the input bits will be described on the assumption of the condition A1.

In condition A1, if 10 input information bits are divided in a 1:9 ratio, then 30 coded output symbols are divided in a 3:27 ratio, and if the 10 input information bits are divided in 2:8, then the 30 coded output symbols are divided in a 6:24 ratio. Further, if the 10 input information bits are divided in a 3:7 ratio, then the 30 coded output symbols are divided in a 9:21 ratio, and if the 10 input information bits are divided in a 4:6 ratio, then the 30 coded output symbols are divided in a 12:18 ratio. However, in conditions A2, A3, and A4, the 32 coded symbols are all transmitted or the 32 coded symbols are repeatedly transmitted, so the coded symbols cannot be correctly divided as in the condition A1.

Therefore, in the embodiment of the present invention, the coding rates of the coded symbols defined in association with the input bits can be expressed as shown in Table 1.

TABLE 1

| Ratio of Input Bits | Ratio of Coded Symbols | Coding Rate Used | |
|---|---|---|---|
| | | Coding Rate of 1st TFCI | Coding Rate of 2nd TFCI |
| 1:9 | 3:29 | (3:1) | (29:9) |
| | 4:28 | (4:1) | (28:9) |
| | 5:27 | (5:1) | (27:9) |
| 2:8 | 6:26 | (6:2) | (26:8) |
| | 7:25 | (7:2) | (25:8) |
| | 8:24 | (8:2) | (24:8) |
| 3:7 | 9:23 | (9:3) | (23:7) |
| | 10:22 | (10:3) | (22:7) |
| | 11:21 | (11:3) | (21:7) |
| 4:6 | 12:20 | (12:4) | (20:6) |
| | 13:19 | (13:4) | (19:6) |
| | 14:18 | (14:4) | (18:6) |
| 6:4 | 18:14 | (18:6) | (14:4) |
| | 19:13 | (19:6) | (13:4) |
| | 20:12 | (20:6) | (12:4) |
| 7:3 | 21:11 | (21:7) | (11:3) |
| | 22:10 | (22:7) | (10:3) |
| | 23:9 | (23:7) | (9:3) |
| 8:2 | 24:8 | (24:8) | (8:2) |
| | 25:7 | (25:8) | (7:2) |
| | 26:6 | (26:8) | (6:2) |
| 9:1 | 27:5 | (27:9) | (5:1) |
| | 28:4 | (28:9) | (4:1) |
| | 29:3 | (29:9) | (3:1) |

A criterion for determining the coding rates in Table 1 according to the ratio of the input bits will be described herein below. The embodiment of the present invention sets the sum of the coded symbols to 30 by applying the minimum required value to the substantial coding rate (30,10) for the most frequently used case A1 among the conditions A1, A2, A3, and A4, and setting the coding rate of the first TFCI and the coding rate of the second TFCI to a minimum of ⅓, and then allocates the remaining 2 coded symbols to the coded symbol of the first TFCI and coded symbol of the second TFCI, respectively. Therefore, the embodiment of the present invention increases both the coding rate of the first TFCI and the coding rate of the second TFCI, or increases either the coding rate of the first TFCI or the coding rate of the second TFCI, using the remaining 2 coded symbols as coded symbols of the first TFCI or coded symbols of the second TFCI. The embodiment increases the coding rate of either the first TFCI or the second TFCI among the criteria for determining the coding rates, when it is necessary to increase performance by increasing only the coding rate of the first TFCI or the coding rate of the second TFCI on a condition that the sum of the number of the coded symbols for the first TFCI and the number of the coded symbols for the second TFCI should become 32.

Once a ratio of the input bits in Table 1 is determined, one Of 3 coding methods is used according to the ratio of the coded symbols.

The present invention provides an encoder capable of performing encoding at all the coding rates illustrate in Table 1. Referring to Table 1, if a ratio of the input bits (or a ratio of information amounts, i.e., a ratio of the first TFCI bits and the second TFCI bits) is 1:9, a ratio of the coded symbols becomes 3:29, 4:28, or 5:27. If the ratio of the input bits is 2:8, the ratio of the coded symbols becomes 6:26, 7:25, or 8:24, and if the ratio of the input bits is 3:7, the ratio of the coded symbols becomes 9:23, 10:22, or 11:21. If the ratio of the input bits is 4:6, the ratio of the coded symbols becomes 12:20, 13:19, or 14:18. If the ratio of the input bits is 6:4, the ratio of the coded symbols becomes 18:14, 19:13, or 20:12, and if the ratio of the input bits is 7:3, the ratio of the coded symbols becomes 21:11, 22: 10, or 23:9. If the ratio of the input bits is 8:2, the ratio of the coded symbols becomes 24:8, 25:7, or 26:6, and if the ratio of the input bits is 9: 1, the ratio of the coded symbols becomes 27:5, 28:4, or 29:3.

Therefore, if the ratio of input bits is 1:9, then {(3,1) encoder, (29,9) encoder, (4,1) encoder, and (28,9) encoder} or {(5,1) encoder and (27,9) encoder} are required. If the ratio of input bits is 2:8, then {(6,2) encoder, (26,8) encoder, (7,2) encoder, and (25,8) encoder} or {(8,2) encoder and (24,8) encoder} are required. If the ratio of input bits is 3:7, then {(9,3) encoder, (23,7) encoder, (10,3) encoder, and (22,7) encoder} or {(11,3) encoder and (21,7) encoder} are required. If the ratio of input bits is 4:6, then {(12,4) encoder, (20,6) encoder, (13,4) encoder, and (19,6) encoder} or {(14, 4) encoder and (18,6) encoder} are required. Therefore, considering the 24 encoders and the currently used (16,5) encoder, and (32,10) encoder, there is a need for an encoder capable of serving as the 18 encoders with a single structure in order to increase performance and reduce the hardware complexity.

In general, Hamming distance distribution for codewords of the error correcting codes can serve as a measure indicating the performance of linear error correcting codes. The "Hamming distance" means the number of non-zero symbols in a codeword. That is, for a certain codeword '0111', the number of 1's included in the codeword is 3, so the Hamming distance is 3. The smallest value among the Hamming distance values is called a "minimum distance $d_{min}$", and an increase in the minimum distance of the codeword improves the error correcting performance of the error correcting codes. In other words, the "optimal code" means a code having the optimal error correcting performance. This is disclosed in detail in a paper, *The Theory of Error-Correcting Codes*, F. J. Macwilliams, N. J. A. Sloane, North-Holland.

In addition, in order to use a single encoder structure for the encoders having different lengths for a reduction in the hardware complexity, it is preferable to shorten the code with longest length, i.e., the (32,10) code. For the shortening, it is necessary to puncture the coded symbols. However, during the puncturing, the minimum distance of the code varies according to the puncturing positions. Therefore, it is preferable to calculate the puncturing positions such that the punctured code has the minimum distance.

For example, in terms of the minimum distance, it is most preferable to use an optimal (7,2) code having one of the coding rates illustrated in Table 1, obtained by repeating a (3,2) simplex code 3 times and then puncturing the last two coded symbols. Table 2 illustrates the relationship between input information bits of the (3,2) simplex code and (3,2) simplex codewords output based on the input information bits.

TABLE 2

| Input Information Bits | (3, 2) Simplex Codewords |
|---|---|
| 00 | 000 |
| 01 | 101 |
| 10 | 011 |
| 11 | 110 |

Table 3 illustrates the relationship between the input information bits and (7,2) simplex codewords obtained by repeating the (3,2) simplex codeword 3 times and then puncturing the last two coded symbols.

TABLE 3

| Input Information Bits | (7, 2) Simplex Codewords |
|---|---|
| 00 | 000 000 0 |
| 01 | 101 101 1 |
| 10 | 011 011 0 |
| 11 | 110 110 1 |

However, the (7,2) simplex codewords obtained by repeating the (3,2) simplex codeword 3 times and then puncturing the last two coded symbols can be implemented by shortening the existing (16,4) Reed-Muller code.

A description of the shortening method will first be made by way of example. The (16,4) Reed-Muller code is a linear combination of 4 basis codewords of length 16, where '4' is the number of input information bits. Receiving only 2 bits among the 16 input information bits is equivalent to using a linear combination of only 2 basis codewords among the 4 basis codewords of length 16 and not using the remaining codewords. In addition, by restricting the use of the basis codewords and then puncturing 9 symbols among 16 symbols, it is possible to realize a (7,2) encoder using the (16,4) encoder. Table 4 illustrates the shortening method.

TABLE 4

| Input Info Bits | Codewords | | | | | | | | | | | | | | | |
|---|---|---|---|---|---|---|---|---|---|---|---|---|---|---|---|---|
| 0000 | 0(*) | 0 | 0 | 0 | 0(*) | 0 | 0 | 0 | 0(*) | 0 | 0(*) | 0(*) | 0(*) | 0(*) | 0(*) | 0(*) |
| 0001 | 0(*) | 1 | 0 | 1 | 0(*) | 1 | 0 | 1 | 0(*) | 1 | 0(*) | 1(*) | 0(*) | 1(*) | 0(*) | 1(*) |
| 0010 | 0(*) | 0 | 1 | 1 | 0(*) | 0 | 1 | 1 | 0(*) | 0 | 1(*) | 1(*) | 0(*) | 0(*) | 1(*) | 1(*) |
| 0011 | 0(*) | 1 | 1 | 0 | 0(*) | 1 | 1 | 0 | 0(*) | 1 | 1(*) | 0(*) | 0(*) | 1(*) | 1(*) | 0(*) |
| 0100 | 0 | 0 | 0 | 0 | 1 | 1 | 1 | 1 | 0 | 0 | 0 | 0 | 1 | 1 | 1 | 1 |
| 0101 | 0 | 1 | 0 | 1 | 1 | 0 | 1 | 0 | 0 | 1 | 0 | 1 | 1 | 0 | 1 | 0 |
| 0110 | 0 | 0 | 1 | 1 | 1 | 1 | 0 | 0 | 0 | 0 | 1 | 1 | 1 | 1 | 0 | 0 |
| 0111 | 0 | 1 | 1 | 0 | 1 | 0 | 0 | 1 | 0 | 1 | 1 | 0 | 1 | 0 | 0 | 1 |
| 1000 | 0 | 0 | 0 | 0 | 0 | 0 | 0 | 0 | 1 | 1 | 1 | 1 | 1 | 1 | 1 | 1 |
| 1001 | 0 | 1 | 0 | 1 | 0 | 1 | 0 | 1 | 1 | 0 | 1 | 0 | 1 | 0 | 1 | 0 |
| 1010 | 0 | 0 | 1 | 1 | 0 | 0 | 1 | 1 | 1 | 1 | 0 | 0 | 1 | 1 | 0 | 0 |
| 1011 | 0 | 1 | 1 | 0 | 0 | 1 | 1 | 0 | 1 | 0 | 0 | 1 | 1 | 0 | 0 | 1 |
| 1100 | 0 | 0 | 0 | 0 | 1 | 1 | 1 | 1 | 1 | 1 | 1 | 1 | 0 | 0 | 0 | 0 |
| 1101 | 0 | 1 | 0 | 1 | 1 | 0 | 1 | 0 | 1 | 0 | 1 | 0 | 0 | 1 | 0 | 1 |
| 1110 | 0 | 0 | 1 | 1 | 1 | 1 | 0 | 0 | 1 | 1 | 0 | 0 | 0 | 0 | 1 | 1 |
| 1111 | 0 | 1 | 1 | 0 | 1 | 0 | 0 | 1 | 1 | 0 | 0 | 1 | 0 | 1 | 1 | 0 |

Referring to Table 4, every (16,4) codeword is a linear combination of the 4 bold basis codewords of length 16. In order to obtain the (6,2) code, only the upper 2 codewords among the 4 basis codewords are used. Then, the remaining lower 12 codewords are automatically unused. Therefore, only the upper 4 codewords are used. Besides, in order to generate a basis codeword of length 7 among the upper 4 basis codewords, it is necessary to puncture 9 symbols. It is possible to obtain the (7,2) simplex codewords of Table 3 by puncturing the symbols indicated by (*) in Table 4 and then collecting the remaining 7 coded symbols.

Herein, a description will be made of a structure of an encoder for creating {(3,1) optimal code, (29,9) optimal code, (4,1) optimal code, and (28,9) optimal code} and {(5,1) optimal code and (27,9) optimal code} used for the information bit ratio of 1:9, a structure of an encoder for creating {(6,2) optimal code, (26,8) optimal code, (7,2) optimal code and (25,8) optimal code} and {(8,2) optimal code and (24,8) optimal code} used for the information bit ratio of 2:8 , a structure of an encoder for creating {(9,3) optimal code, (23,7) optimal code, (10,3) optimal code, and (22,7) optimal code} and {(11,3) optimal code and (21,7) optimal code} used for the information bit ratio of 3:7, a structure of an encoder for creating {(12,4) optimal code, (20,6) optimal code, (13,4) optimal code, and (19,6) optimal code} and {(14,4) optimal code and (18,6) optimal code} used for the information bit ratio of 4:6, and a structure of an encoder for creating a (16,5) optimal code and a (32,10) optimal code used for the information bit ratio of 5:5, by shortening a (32,10) sub-code of the second order Reed-Muller code. In addition, a structure of a decoder corresponding to the encoder will also be described herein below.

1. First Embodiment of Transmitter

An embodiment of the present invention provides an apparatus and method for dividing 10 information bits in a ratio of 1:9, 2:8, 3:7, 4:6, 5:5, 6:4, 7:3, 8:2, or 9:1 before coding in the hard split mode, as done in the logical split mode where the ratio of the input information bits is 5:5.

Figure 2:
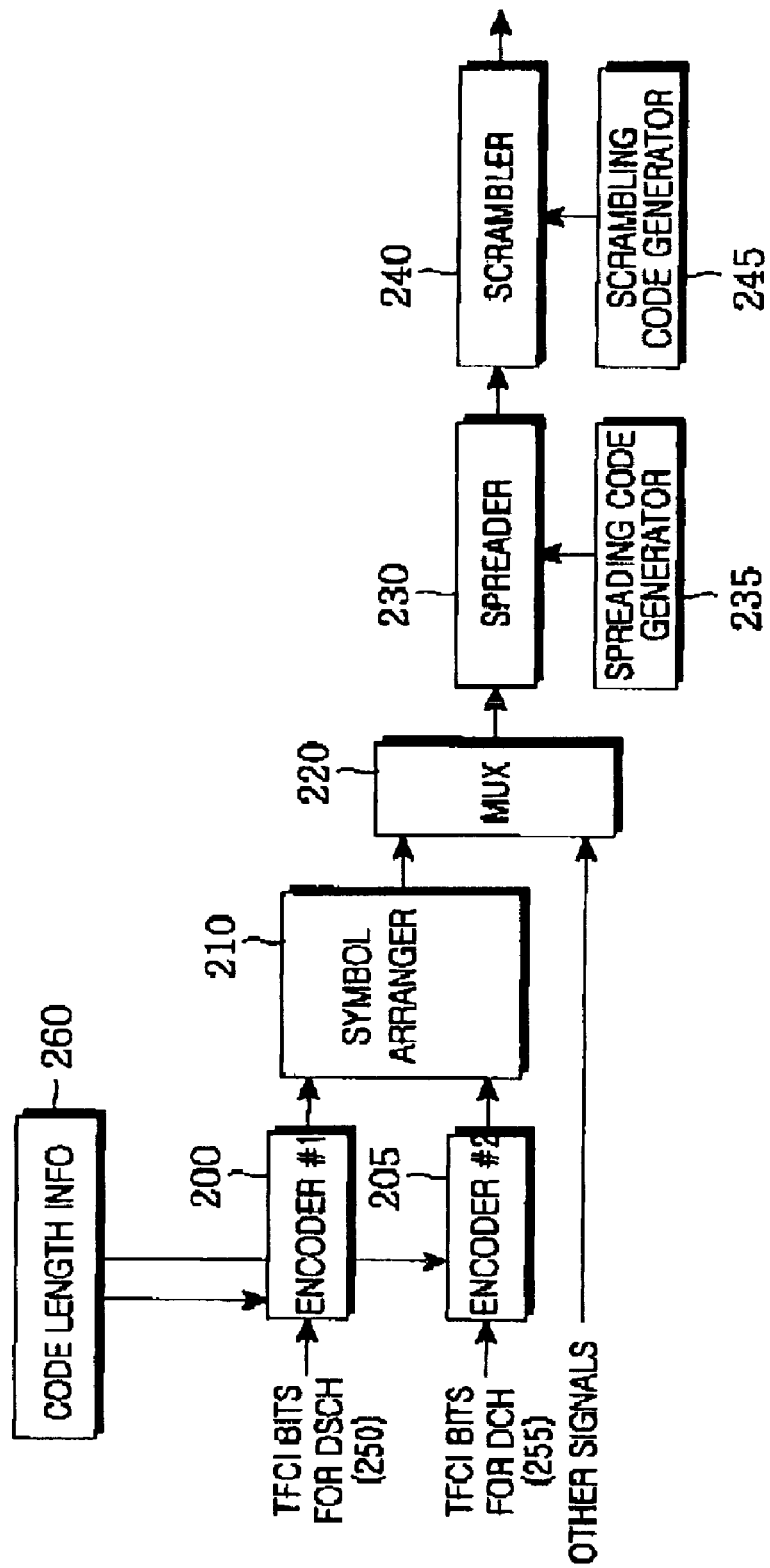
FIG. 2 illustrates a structure of a Node B transmitter according to an embodiment of the present invention.

FIG. 2 illustrates a structure of a transmitter according to an embodiment of the present invention. Referring to FIG. 2, TFCI bits for the DSCH and TFCI bits for the DCH, divided in one of the above information bit ratios, are provided to first and second encoders 200 and 205, respectively. Here, the TFCI bits for the DSCH are referred to as TFCI(field 1) or first TFCI bits, while the TFCI bits for the DCH are referred to as TFCI(field 2) or second TFCI bits. The TFCI bits for the DSCH are generated from a first TFCI bit generator 250, and the TFCI bits for the DCH are generated from a second TFCI bit generator 255. The number of the first TFCI bits is different from the number of the second TFCI bits according to the above information bit ratios. In addition, a control signal indicating code length information, i.e., information on a length value of the codeword set according to the information bit ratio, is provided to the first and second encoders 200 and 205. The code length information is generated from a code length information generator 260, and has a value variable according to lengths of the first TFCI bits and the second TFCI bits.

When the information bit ratio is 6:4, the encoder 200 receives a length control signal for allowing the encoder 200 to serve as a (20,6) encoder, a (19,6) encoder, or an (18,6) encoder upon receipt of 6 TFCI bits for the DSCH, and serves as one of the 3 coders, while the encoder 205 receives a length control signal for allowing the encoder 205 to serve as a (12,4) encoder, a (13,4) encoder, or a (14,4) encoder upon receipt of 4 TFCI bits for the DCH, and serves as one of the 3 coders. When the information bit ratio is 7:3, the encoder 200 receives a length control signal for allowing the encoder 200 to serve as a (23,7) encoder, a (22,7) encoder, or a (21,7) encoder upon receipt of 7 TFCI bits for the DSCH, and serves as one of the 3 coders, while the encoder 205 receives a length control signal for allowing the encoder 205 to serve as a (9,3) encoder, a (10,3) encoder, or an (11,3) encoder upon receipt of 3 TFCI bits for the DCH, and serves as one of the 3 coders. When the information bit ratio is 8:2, the encoder 200 receives a length control signal for allowing the encoder 200 to serve as a (26,8) encoder, a (25,8) encoder, or a (24,8) encoder upon receipt of 8 TFCI bits for the DSCH, and serves as one of the 3 coders, while the encoder 205 receives a length control signal for allowing the encoder 205 to serve as a (6,2) encoder, a (7,2) encoder, or an (8,2) encoder upon receipt of 2 TFCI bits for the DCH, and serves as one of the 3 coders. When the information bit ratio is 9:1, the encoder 200 receives a length control signal for allowing the encoder 200 to serve as a (29,9) encoder, a (28,9) encoder, or a (27,9) encoder upon receipt of 9 TFCI bits for the DSCH, and serves as one of the 3 coders, while the encoder 205 receives a length control signal for allowing the encoder 205 to serve as a (3,1) encoder, a (4,1) encoder, or a (5,1) encoder upon receipt of 1 TFCI bits for the DCH, and serves as one of the 3 coders. The length control signal should be generated such that the sum of the first TFCI bits and the second TFCI bits becomes 32. That is, if the first TFCI encoder is a (4,1) encoder, the second TFCI encoder should be a (28,9) encoder rather than a (29,9) encoder or a (27,9) encoder. If the second TFCI encoder becomes the (29,9) encoder, the number of coded bits $b_l$ becomes 33, and if the second TFCI encoder becomes the (27,9) encoder, the number of coded bits $b_l$ becomes 31. In this case, the transmitter is not compatible with the conventional transmitter that uses two (16,5) encoders or a (32,10) encoder. In addition, the transmitter is not compatible with the conventional transmitter in mapping the $b_l$ bits to the $d_m$ bits.

Figure 3:
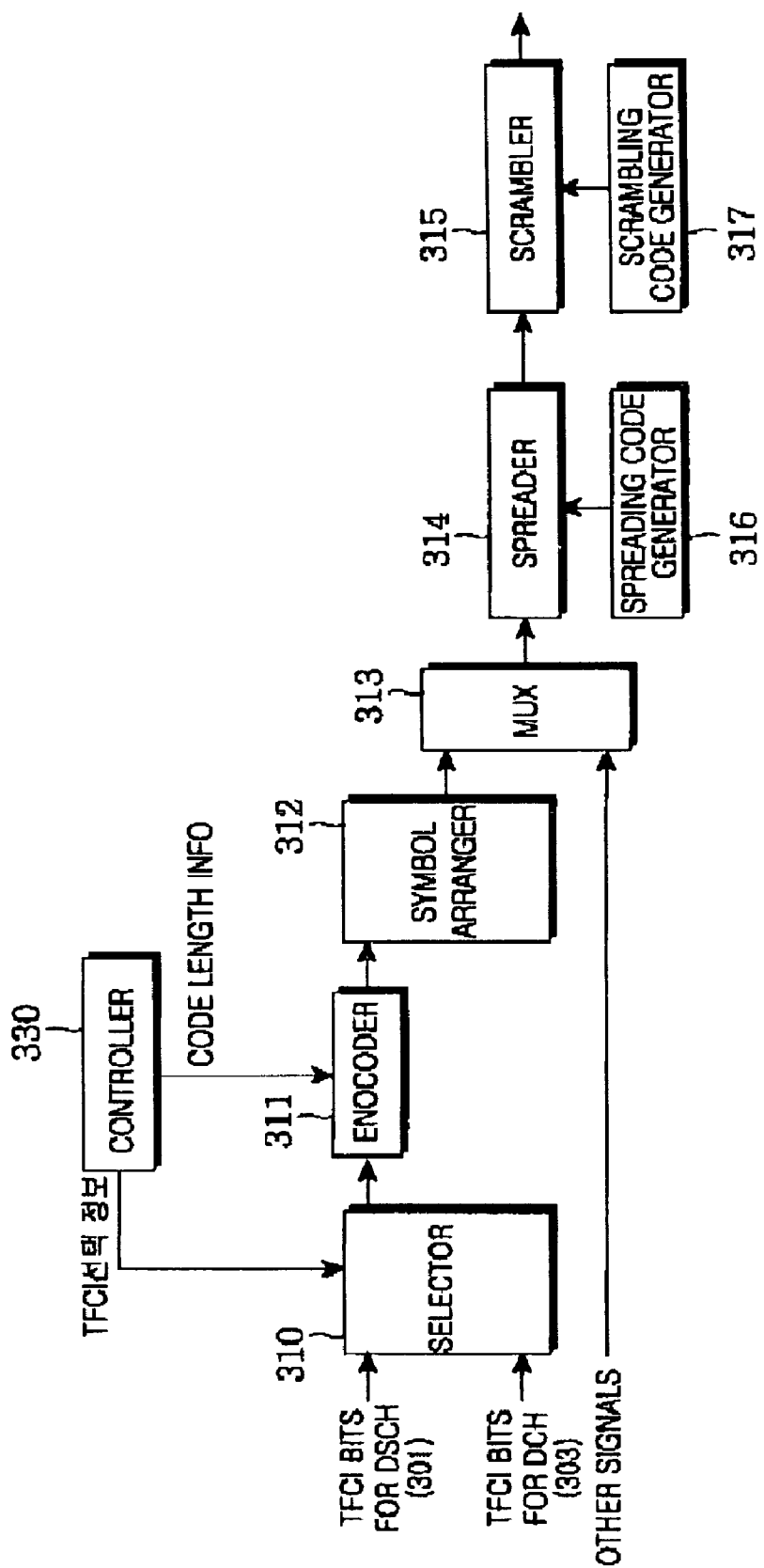
FIG. 3 illustrates another structure of a Node B transmitter according to an embodiment of the present invention.
Figure 4:
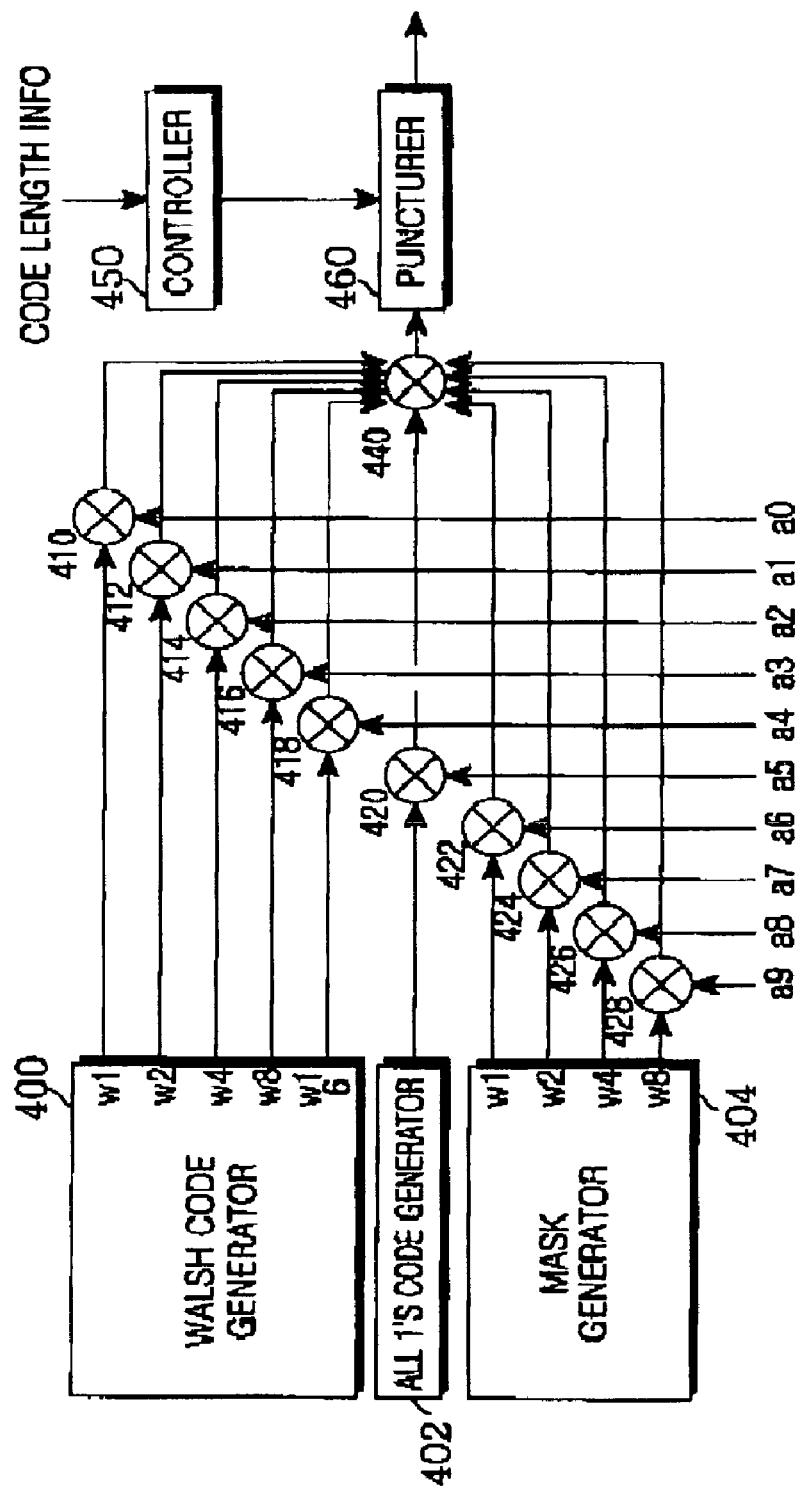
FIG. 4 illustrates a detailed structure of the encoder illustrated in FIGS. 2 and 3.

FIG. 4 illustrates a detailed structure of the encoders 200 and 205. That is, the encoder 200 for encoding the first TFCI encoder and the encoder 205 for encoding the second TFCI encoder have the structure of FIG. 4. However, when generating the first TFCI codewords and the second TFCI codewords with a time delay, the first TFCI encoder and the second TFCI encoder can be realized with a single encoder. A structure of a transmitter for generating the first TFCI codewords and the second TFCI codewords with a time delay is illustrated in FIG. 3.

First, with reference to FIG. 2, a detailed description of an encoder according to the present invention will be made for the case where the ratio of the first TFCI bits to the second TFCI bits is 1:9.

When the information bit ratio is 1:9, the encoder 200 serves as a (3,1) encoder and the encoder 205 serves as a (29,9) encoder; the encoder 200 serves as a (4,1) encoder and the encoder 205 serves as a (28,9) encoder; or the encoder 200 serves as a (5,1) encoder and the encoder 205 serves as a (27,9) encoder.

Now, operations of the (3,1) encoder, the (29,9) encoder, the (4,1) encoder, the (28,9) encoder, the (5,1) encoder, and the (27,9) encoder will be described in detail with reference to FIG. 4.

First, an operation of the (3,1) encoder will be described. Referring to FIG. 4, one input bit a0 is normally provided to the encoder, and the remaining input bits a1, a2, a3, a4, a5, a6, a7, a8, and a9 are all filled with '0'. The input bit a0 is applied to a multiplier 410, the input bit a1 to a multiplier 412, the input bit a2 to a multiplier 414, the input bit a3 to a multiplier 416, the input bit a4 to a multiplier 418, the input bit a5 to a multiplier 420, the input bit a6 to a multiplier 422, the input bit a7 to a multiplier 424, the input bit a8 to a multiplier 426, and the input bit a9 to a multiplier 428. At the same time, a Walsh code generator 400 generates a basis codeword W1=10101010101010110101010101010100, and provides the generated basis codeword W1 to the multiplier 410. The multiplier 410 then multiplies the input bit a0 by the basis codeword W1 in a symbol unit, and provides its output to an exclusive OR (XOR) operator 440. Further, the Walsh code generator 400 generates other basis codewords W2, W4, W8, and W16, and provides them to the multiplier 412, 414, 416, and 418, respectively. An all-1's code generator 402 generates an all-1's basis codeword (or all-1's sequence) and provides the generated all-1's basis codeword to the multiplier 420. A mask generator 404 generates basis codewords M1, M2, M4, and M8, and provides the generated basis codewords M1, M2, M4, and M8 to the multipliers 422, 424, 426, and 428, respectively. However, since the input bits a1, a2, a3, a4, a5, a6, a7, a8 and a9 applied to the multipliers 412, 414, 416, 418, 420, 422, 424, 426, and 428 are all 0's, the multipliers 412, 414, 416, 418, 420, 422, 424, 426, and 428 output 0's to the exclusive OR operator 440, thus not affecting the output of the exclusive OR operator 440. That is, a value determined by XORing the output values of the multipliers 410, 412, 414, 416, 418, 420, 422, 424, 426 and 428 by the exclusive OR operator 440 is equal to the output value of the multiplier 410. The 32 symbols output from the exclusive OR operator 440 are provided to a puncturer 460. At this moment, a controller 450 receives code length information and provides the puncturer 460 with a control signal indicating puncturing positions based on the code length information. The puncturer 460 then punctures $1^{st}$, $3^{rd}$, $5^{th}$, $6^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, 30 and $31^{st}$ coded symbols among a total of 32 coded symbols of $0^{th}$ to $31^{th}$ symbols according to the control signal output from the controller 450. In other words, the puncturer 460 punctures 29 symbols among the 32 coded symbols, and thus outputs 3 non-punctured coded symbols.

Second, an operation of the (29,9) encoder will be described. Referring to FIG. 4, nine input bits a0, a1, a2, a3, a4, a5, a6, a7, and a8 are normally provided to the encoder, and the remaining input bit a9 is filled with '0'. The input bit a0 is applied to the multiplier 410, the input bit a1 to the multiplier 412, the input bit a2 to the multiplier 414, the input bit a3 to the multiplier 416, the input bit a4 to the multiplier 418, the input bit a5 to the multiplier 420, the input bit a6 to the multiplier 422, the input bit a7 to the multiplier 424, the input bit a8 to the multiplier 426, and the input bit a9 to the multiplier 428. At the same time, the Walsh code generator 400 provides the multiplier 410 with the basis codeword W1=10101010101010110101010101010100, the multiplier 412 with the basis codeword W2=01100110011001101100110011001100, the multiplier 414 with the basis codeword W4=00011110000111100011110000111100, the multiplier 416 with the basis codeword W8=00000001111111100000001111111100, and the multiplier 418 with the basis codeword W16=00000000000000011111111111111101. Then, the multiplier 410 multiplies the basis codeword W1 by the input bit a0 in the symbol unit and provides its output to the exclusive OR operator 440, the multiplier 412 multiplies the basis codeword W2 by the input bit a1 in the symbol unit and provides its output to the exclusive OR operator 440, the multiplier 414 multiplies the basis codeword W4 by the input bit a2 in the symbol unit and provides its output to the exclusive OR operator 440, the multiplier 416 multiplies the basis codeword W8 by the input bit a3 in the symbol unit and provides its output to the exclusive OR operator 440, and the multiplier 418 multiplies the basis codeword W16 by the input bit a4 in the symbol unit and provides its output to the exclusive OR operator 440. In addition, the all-1's code generator 402 generates an all-1's basis codeword of length 32 and provides the generated all-1's basis codeword to the multiplier 420. The multiplier 420 then multiplies the all-1's basis codeword by the input bit a5 in the symbol unit and provides its output to the exclusive OR operator 440. The mask generator 404 provides the multiplier 422 with the basis codeword M1=0101 0000 1100 0111 1100 0001 1101 1101, the multiplier 424 with the basis codeword M2=0000 0011 1001 1011 1011 0111 0001 1100, and the multiplier 426 with the basis codeword M4=0001 0101 1111 0010 0110 1100 1010 1100. Then, the multiplier 422 multiplies the basis codeword M1 by the input bit a6 in the symbol unit and provides its output to the exclusive OR operator 440, the multiplier 424 multiplies the basis codeword M2 by the input bit a7 in the symbol unit and provides its output to the exclusive OR operator 440, and the multiplier 426 multiplies the basis codeword M4 by the input bit a8 in the symbol unit and provides its output to the exclusive OR operator 440. Further, the mask generator 404 generates the other basis codeword M8, and provides the generated basis codeword M8 to the multiplier 428. However, since the input bit a9 applied to the multiplier 428 is 0, the multiplier 428 outputs 0 to the exclusive OR operator 440, thus not affecting the output of the exclusive OR operator 440. That is, a value determined by XORing the output values of the multipliers 410, 412, 414, 416, 418, 420, 422, 424, 426, and 428 by the exclusive OR operator 440 is equal to a value determined by XORing the output values of the multipliers 410, 412, 414, 416, 418, 420, 422, 424, and 426. The 32 symbols output from the exclusive OR operator 440 are provided to the puncturer 460. At this moment, the controller 450 receives code length information and provides the puncturer 460 with a control signal indicating puncturing positions based on the code length information. The puncturer 460 then punctures $6^{th}$, $10^{th}$, and $11^{th}$ coded symbols among a total of 32 coded symbols of $0^{th}$ to $31^{st}$ symbols according to the control signal output from the controller 450. In other words, the puncturer 460 punctures 3 symbols among the 32 coded symbols, and thus outputs 29 non-punctured coded symbols.

Third, an operation of the (4,1) encoder will be described. Referring to FIG. 4, one input bit a0 is normally provided to the encoder, and the remaining input bits a1, a2, a3, a4, a5, a6, a7, a8, and a9 are all filled with '0'. The input bit a0 is applied to the multiplier 410, the input bit a1 to the multiplier 412, the input bit a2 to the multiplier 414, the input bit a3 to the multiplier 416, the input bit a4 to the multiplier 418, the input bit a5 to the multiplier 420, the input bit a6 to the multiplier 422, the input bit a7 to the multiplier 424, the input bit a8 to the multiplier 426, and the input bit a9 to the multiplier 428. At the same time, the Walsh code generator 400 generates a basis codeword W1=10101010101010110101010101010100, and provides the generated basis codeword W1 to the multiplier 410. The multiplier 410 then multiplies the input bit a0 by the basis codeword W1 in a symbol unit, and provides its output to the XOR operator 440. Further, the Walsh code generator 400 generates the other basis codewords W2, W4, W8 and W16, and provides them to the multiplier 412, 414, 416 and 418, respectively. The all-1's code generator 402 generates an all-1's basis codeword (or all-1's sequence) and provides the generated all-1's basis codeword to the multiplier 420. The mask generator 404 generates basis codewords M1, M2, M4, and M8, and provides the generated basis codewords M1, M2, M4, and M8 to the multipliers 422, 424, 426, and 428, respectively. However, since the input bits a1, a2, a3, a4, a5, a6, a7, a8, and a9 applied to the multipliers 412, 414, 416, 418, 420, 422, 424, 426, and 428 are all 0's, the multipliers 412, 414, 416, 418, 420, 422, 424, 426, and 428 output 0's to the exclusive OR operator 440, thus not affecting the output of the exclusive OR operator 440. That is, a value determined by XORing the output values of the multipliers 410, 412, 414, 416, 418, 420, 422, 424, 426, and 428 by the exclusive OR operator 440 is equal to the output value of the multiplier 410. The 32 symbols output from the exclusive OR operator 440 are provided to the puncturer 460. At this moment, the controller 450 receives code length information and provides the puncturer 460 with a control signal indicating puncturing positions based on the code length information. The puncturer 460 then punctures $1^{st}$, $3^{rd}$, $5^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 450. In other words, the puncturer 460 punctures 28 symbols among the 32 coded symbols, and thus outputs 4 non-punctured coded symbols.

Fourth, an operation of the (28,9) encoder will be described. Referring to FIG. 4, nine input bits a0, a1, a2, a3, a4, a5, a6, a7, and a8 are normally provided to the encoder, and the remaining input bit a9 is filled with '0'. The input bit a0 is applied to the multiplier 410, the input bit a1 to the multiplier 412, the input bit a2 to the multiplier 414, the input bit a3 to the multiplier 416, the input bit a4 to the multiplier 418, the input bit a5 to the multiplier 420, the input bit a6 to the multiplier 422, the input bit a7 to the multiplier 424, the input bit a8 to the multiplier 426, and the input bit a9 to the multiplier 428. At the same time, the Walsh code generator 400 provides the multiplier 410 with the basis codeword W1=10101010101010110101010101010100, the multiplier 412 with the basis codeword W2=01100110011001101100110011001100, the multiplier 414 with the basis codeword W4=00011110000111100011110000111100, the multiplier 416 with the basis codeword W8=00000001111111100000001111111100, and the multiplier 418 with the basis codeword W16=00000000000000011111111111111101. Then, the multiplier 410 multiplies the basis codeword W1 by the input bit a0 in the symbol unit and provides its output to the exclusive OR operator 440, the multiplier 412 multiplies the basis codeword W2 by the input bit a1 in the symbol unit and provides its output to the exclusive OR operator 440, the multiplier 414 multiplies the basis codeword W4 by the input bit a2 in the symbol unit and provides its output to the exclusive OR operator 440, the multiplier 416 multiplies the basis codeword W8 by the input bit a3 in the symbol unit and provides its output to the exclusive OR operator 440, and the multiplier 418 multiplies the basis codeword W16 by the input bit a4 in the symbol unit and provides its output to the exclusive OR operator 440. In addition, the all-1's code generator 402 generates an all-1's basis codeword of length 32 and provides the generated all-1's basis codeword to the multiplier 420. The multiplier 420 then multiplies the all-1's basis codeword by the input bit a5 in the symbol unit and provides its output to the exclusive OR operator 440. The mask generator 404 provides the multiplier 422 with the basis codeword M1 0101 0000 1100 0111 1100 0001 1101 1101, the multiplier 424 with the basis codeword M2=0000 0011 1001 1011 1011 0111 0001 1100, and the multiplier 426 with the basis codeword M4=0001 0101 1111 0010 0110 1100 1010 1100. Then, the multiplier 422 multiplies the basis codeword M1 by the input bit a6 in the symbol unit and provides its output to the exclusive OR operator 440, the multiplier 424 multiplies the basis codeword M2 by the input bit a7 in the symbol unit and provides its output to the exclusive OR operator 440, and the multiplier 426 multiplies the basis codeword M4 by the input bit a8 in the symbol unit and provides its output to the exclusive OR operator 440. Further, the mask generator 404 generates the other basis codeword M8, and provides the generated basis codeword M8 to the multiplier 428. However, since the input bit a9 applied to the multiplier 428 is 0, the multiplier 428 outputs 0 to the exclusive OR operator 440, thus not affecting the output of the exclusive OR operator 440. That is, a value determined by XORing the output values of the multipliers 410, 412, 414, 416, 418, 420, 422, 424, 426, and 428 by the exclusive OR operator 440 is equal to a value determined by XORing the output values of the multipliers 410, 412, 414, 416, 418, 420, 422, 424, and 426. The 32 symbols output from the exclusive OR operator 440 are provided to the puncturer 460. At this moment, the controller 450 receives code length information and provides the puncturer 460 with a control signal indicating puncturing positions based on the code length information. The puncturer 460 then punctures $6^{th}$, $10^{th}$, $11^{th}$, and $30^{th}$ coded symbols among a total of 32 coded symbols of $0^{th}$ to $31^{st}$ symbols according to the control signal output from the controller 450. In other words, the puncturer 460 punctures 4 symbols among the 32 coded symbols, and thus outputs 28 non-punctured coded symbols.

Fifth, an operation of the (5,1) encoder will be described. Referring to FIG. 4, one input bit a0 is normally provided to the encoder, and the remaining input bits a1, a2, a3, a4, a5, a6, a7, a8, and a9 are all filled with '0'. The input bit a0 is applied to the multiplier 410, the input bit a1 to the multiplier 412, the input bit a2 to the multiplier 414, the input bit a3 to the multiplier 416, the input bit a4 to the multiplier 418, the input bit a5 to the multiplier 420, the input bit a6 to the multiplier 422, the input bit a7 to the multiplier 424, the input bit a8 to the multiplier 426, and the input bit a9 to the multiplier 428. At the same time, the Walsh code generator 400 generates the basis codeword W1=10101010101010110101010101010100, and provides the generated basis codeword to the multiplier 410. The multiplier 410 then multiplies the basis codeword W1 by the input bit a0 in the symbol unit and provides its output to the exclusive OR operator 440. Further, the Walsh code generator 400 generates the other basis codewords W2, W4, W8, and W16, and provides the generated basis codewords W2, W4, W8, and W16 to the multipliers 412, 414, 416, and 418, respectively. The all-1's code generator 402 generates an all-1's basis codeword of length 32 and provides the generated all-1's basis codeword to the multiplier 420. Further, the mask generator 404 generates the basis codewords M1, M2, M4, and M8, and provides the generated basis codewords M1, M2, M4, and M8 to the multipliers 422, 424, 426, and 428, respectively. However, since the input bits a 1, a2, a3, a4, a5, a6, a7, a8, and a9 applied to the multipliers 412, 414, 416, 418, 420, 422, 424, 426, and 428 are all 0's, the multipliers 412, 414, 416, 418, 420, 422, 424, 426, and 428 output 0's to the exclusive OR operator 440, thus not affecting the output of the exclusive OR operator 440. That is, a value determined by XORing the output values of the multipliers 410, 412, 414, 416, 418, 420, 422, 424, 426, and 428 by the exclusive OR operator 440 is equal to the output value of the multiplier 410. The 32 symbols output from the exclusive OR operator 440 are provided to the puncturer 460. At this moment, the controller 450 receives code length information and provides the puncturer 460 with a control signal indicating puncturing positions based on the code length information. The puncturer 460 then punctures $1^{st}$, $3^{rd}$, $5^{th}$, $7^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 450. In other words, the puncturer 460 punctures 27 symbols among the 32 coded symbols, and thus outputs 5 non-punctured coded symbols.

Sixth, an operation of the (27,9) encoder will be described. Referring to FIG. 4, nine input bits a0, a1, a2, a3, a4, a5, a6, a7, and a8 are normally provided to the encoder, and the remaining input bit a9 is filled with '0'. The input bit a0 is applied to the multiplier 410, the input bit a1 to the multiplier 412, the input bit a2 to the multiplier 414, the input bit a3 to the multiplier 416, the input bit a4 to the multiplier 418, the input bit a5 to the multiplier 420, the input bit a6 to the multiplier 422, the input bit a7 to the multiplier 424, the input bit a8 to the multiplier 426, and the input bit a9 to the multiplier 428. At the same time, the Walsh code generator 400 provides the multiplier 410 with the basis codeword W1=10101010101010110101010101010100, the multiplier 412 with the basis codeword W2=01100110011001101100110011001100, the multiplier 414 with the basis codeword W4=00011110000111100011110000111100, the multiplier 416 with the basis codeword W8=00000001111111100000001111111100, and multiplier 418 with the basis codeword W16=00000000000000011111111111111101. Then, the multiplier 410 multiplies the basis codeword W1 by the input bit a0 in the symbol unit and provides its output to the exclusive OR operator 440, the multiplier 412 multiplies the basis codeword W2 by the input bit a1 in the symbol unit and provides its output to the exclusive OR operator 440, the multiplier 414 multiplies the basis codeword W4 by the input bit a2 in the symbol unit and provides its output to the exclusive OR operator 440, the multiplier 416 multiplies the basis codeword W8 by the input bit a3 in the symbol unit and provides its output to the exclusive OR operator 440, and the multiplier 418 multiplies the basis codeword W16 by the input bit a4 in the symbol unit and provides its output to the exclusive OR operator 440. The all-1's code generator 402 generates an all-1's basis codeword and provides the generated all-1's basis codeword to the multiplier 420. The multiplier 420 then multiplies the all-1's basis codeword by the input bit a5 in the symbol unit and provides its output to the exclusive OR operator 440. The mask generator 404 provides the multiplier 422 with the basis codeword M1=01010000110001111100000111011101, the multiplier 424 with the basis codeword M2=00000011100110111011011100011100, and the multiplier 426 with the basis codeword M4=00010101111100100110110010101100. Then, the multiplier 422 multiplies the basis codeword M1 by the input bit a6 in the symbol unit and provides its output to the exclusive OR operator 440, the multiplier 424 multiplies the basis codeword M2 by the input bit a7 in the symbol unit and provides its output to the exclusive OR operator 440, and the multiplier 426 multiplies the basis codeword M4 by the input bit a8 in the symbol unit and provides its output to the exclusive OR operator 440. Further, the mask generator 404 generates the other basis codeword M8, and provides the generated basis codeword M8 to the multiplier 428. However, since the input bit a9 applied to the multiplier 428 is 0, the multiplier 428 outputs 0's to the exclusive OR operator 440, thus not affecting the output of the exclusive OR operator 440. That is, a value determined by XORing the output values of the multipliers 410, 412, 414, 416, 418, 420, 422, 424, 426, and 428 by the exclusive OR operator 440 is equal to a value determined by XORing the output values of the multipliers 410, 412, 414, 416, 418, 420, 422, 424, and 426. The 32 symbols output from the exclusive OR operator 440 are provided to the puncturer 460. At this moment, the controller 450 receives code length information and provides the puncturer 460 with a control signal indicating puncturing positions based on the code length information. The puncturer 460 then punctures $0^{th}$, $2^{nd}$, $8^{th}$, $19^{th}$, and $20^{th}$ coded symbols among a total of 32 coded symbols of $0^{th}$ to $31^{st}$ symbols according to the control signal output from the controller 450. In other words, the puncturer 460 punctures 5 symbols among the 32 coded symbols, and thus outputs 27 non-punctured coded symbols.

Table 5 below illustrates puncturing patterns with which all the encoders of Table 1 can be realized by the encoder of FIG. 4. The puncturing patterns of Table 5 are applied to the puncturer 460 of FIG. 4 to realize a (n,k) code (where n=3, 4, ..., 14, 18, 19, ..., 29, and k=1, 2, 3, 4, 6, 7, 8, 9).

TABLE 5

| Code | 0 1 2 3 4 | 5 6 7 8 9 | 10 11 12 13 14 | 15 16 17 18 19 | 20 21 22 23 24 | 25 26 27 28 29 | 30 31 |
|---|---|---|---|---|---|---|---|
| (3,1) | 1 0 1 0 1 | 0 0 0 0 0 | 0 0 0 0 0 | 0 0 0 0 0 | 0 0 0 0 0 | 0 0 0 0 0 | 0 0 |
| (4,1) | 1 0 1 0 1 | 0 1 0 0 0 | 0 0 0 0 0 | 0 0 0 0 0 | 0 0 0 0 0 | 0 0 0 0 0 | 0 0 |
| (5,1) | 1 0 1 0 1 | 0 1 0 1 0 | 0 0 0 0 0 | 0 0 0 0 0 | 0 0 0 0 0 | 0 0 0 0 0 | 0 0 |
| (6,2) | 1 1 1 0 1 | 1 1 0 0 0 | 0 0 0 0 0 | 0 0 0 0 0 | 0 0 0 0 0 | 0 0 0 0 0 | 0 0 |
| (7,2) | 1 1 1 0 1 | 1 1 0 1 0 | 0 0 0 0 0 | 0 0 0 0 0 | 0 0 0 0 0 | 0 0 0 0 0 | 0 0 |
| (8,2) | 1 1 1 0 1 | 1 1 0 1 1 | 0 0 0 0 0 | 0 0 0 0 0 | 0 0 0 0 0 | 0 0 0 0 0 | 0 0 |
| (9,3) | 1 1 1 1 1 | 1 1 0 0 1 | 1 0 0 0 0 | 0 0 0 0 0 | 0 0 0 0 0 | 0 0 0 0 0 | 0 0 |
| (10,3) | 1 1 1 1 1 | 1 1 0 1 1 | 0 1 0 0 0 | 0 0 0 0 0 | 0 0 0 0 0 | 0 0 0 0 0 | 0 0 |
| (11,3) | 1 1 1 1 1 | 1 1 0 0 0 | 0 1 1 1 1 | 0 0 0 0 0 | 0 0 0 0 0 | 0 0 0 0 0 | 0 0 |
| (12,4) | 0 0 0 1 1 | 1 1 1 1 1 | 1 1 1 1 1 | 0 0 0 0 0 | 0 0 0 0 0 | 0 0 0 0 0 | 0 0 |
| (13,4) | 0 0 0 1 1 | 1 1 1 1 1 | 1 1 1 1 1 | 1 0 0 0 0 | 0 0 0 0 0 | 0 0 0 0 0 | 0 0 |
| (14,4) | 0 0 0 1 1 | 1 1 1 1 1 | 1 1 1 1 1 | 1 1 0 0 0 | 0 0 0 0 0 | 0 0 0 0 0 | 0 0 |
| (18,6) | 0 1 1 1 1 | 1 1 0 1 0 | 1 0 1 1 1 | 1 0 1 1 0 | 1 1 1 1 0 | 0 0 0 0 0 | 0 0 |
| (19,6) | 1 1 1 1 1 | 1 0 1 1 1 | 0 0 1 0 0 | 1 0 0 1 0 | 0 1 0 1 0 | 1 0 1 1 1 | 1 0 |
| (20,6) | 1 1 1 1 1 | 1 1 1 1 1 | 0 1 0 0 0 | 1 1 1 1 0 | 0 0 1 0 0 | 1 1 0 0 1 | 1 0 |
| (21,7) | 0 0 0 0 0 | 0 1 0 1 1 | 1 1 0 1 1 | 1 1 1 0 1 | 1 0 1 1 0 | 1 1 1 1 1 | 1 1 |
| (22,7) | 1 1 1 1 1 | 1 1 1 0 1 | 1 1 0 1 1 | 1 0 1 0 0 | 1 1 1 0 1 | 1 0 0 1 1 | 0 0 |
| (23,7) | 1 1 1 1 0 | 1 1 1 0 0 | 1 1 0 1 1 | 1 0 1 0 1 | 1 1 1 0 0 | 1 1 1 1 1 | 0 1 |
| (24,8) | 1 0 1 1 1 | 1 1 0 1 1 | 1 1 1 0 1 | 0 1 1 1 1 | 0 1 1 1 1 | 0 1 1 1 1 | 0 0 |
| (25,8) | 1 1 1 1 0 | 1 1 1 1 1 | 1 0 1 1 0 | 0 1 1 1 1 | 0 0 0 1 1 | 1 1 1 1 1 | 1 1 |

TABLE 5-continued

| Code | 0 1 2 3 4 | 5 6 7 8 9 | 10 11 12 13 14 | 15 16 17 18 19 | 20 21 22 23 24 | 25 26 27 28 29 | 30 31 |
|---|---|---|---|---|---|---|---|
| (26,8) | 1 1 1 1 1 | 1 1 0 1 1 | 1 1 1 0 1 | 0 1 1 1 1 | 0 1 1 1 1 | 0 1 1 1 1 | 0 1 |
| (27,9) | 0 1 0 1 1 | 1 1 1 0 1 | 1 1 1 1 1 | 1 1 1 1 0 | 0 1 1 1 1 | 1 1 1 1 1 | 1 1 |
| (28,9) | 1 1 1 1 1 | 1 0 1 1 1 | 0 0 1 0 1 | 1 1 1 1 1 | 1 1 1 1 1 | 1 1 1 1 1 | 1 1 |
| (29,9) | 1 1 1 1 1 | 1 0 1 1 1 | 0 0 1 1 1 | 1 1 1 1 1 | 1 1 1 1 1 | 1 1 1 1 1 | 1 1 |

In Table 5, '0' represents a position where the coded symbol is punctured, while '1' represents a position where the coded symbol is not punctured. By using the puncturing patterns of Table 5, it is possible to calculate the first coded TFCI symbols and the second coded TFCI symbols even for the cases where the ratios of the first TFCI information bits to the second TFCI information bits are 2:8, 3:7, 4:6, 6:4, 7:3, 8:2, and 9:1. The operation of the encoders 200 and 205 should become more apparent from the puncturing patterns of Table 5 and the previous description made for the case where the ratio of the first TFCI information bits to the second TFCI information bits is 1:9.

After the above operations, the coded symbols output from the encoders 200 and 205 are arranged (or time-multiplexed) by an arranger (or multiplexer) 210, generating a 32-symbol multiplexed signal.

Next, a description will be made of a method for arranging the first coded TFCI symbols and the second coded TFCI symbols by the coded symbol arranger 210. The coded symbol arranger 210 arranges the first coded TFCI symbols and the second coded TFCI symbols output from the encoders 200 and 205 such that the coded TFCI symbols are arranged as uniformly as possible in one radio frame. That is, the coded symbols arranger 210 maps the information bits $a_k$ to the coded bits $b_l$, defined in the description of the prior art. Of the coded symbols obtained by encoding the information bits $a_k$, an $x^{th}$ coded symbol among the coded symbols obtained by encoding the first TFCI bits is defined as $c_x^1$, where x is an integer including '0', and a $y^{th}$ coded symbol among the coded symbols obtained by encoding the second TFCI bits is defined as $c_y^2$, where y is an integer including '0'. The sum of an x value of the last symbol for the $c_x^1$ and a y value of the last symbol for the $c_y^2$ should always be 32. Also, the sum of the number of the coded symbols $c_x^1$ and the number of the coded symbols $c_y^2$ is 32. Therefore, the coded symbol arranger 210 has a function of mapping the coded symbols $c_x^1$ and $c_y^2$ to the bits $b_l$. The $b_l$ bits are mapped to the $d_m$ bits before being transmitted over the actual radio frame for the respective conditions A1, A2, A3, and A4.

In conditions A2, A3, and A4, all of 32 $b_l$ bits are transmitted desirably. However, in condition A1, the bits $d_{30}(b_{30})$ and $d_{31}(b_{31})$ are not transmitted, so it is necessary to select one of the coded symbols $c_x^1$ and $x_y^2$, to be mapped to the bits $d_{30}(b_{30})$ and $d_{31}(b_{31})$. The rules of mapping the coded symbols $c_x^1$ and $x_y^2$ to the bits $d_{30}(b_{30})$ and $d_{31}(b_{31})$ are given below.

Rule 1: the last coded symbols of the first coded TFCI symbols and the second coded TFCI symbols are mapped to $d_{30}(b_{30})$ and $d_{31}(b_{31})$.

Rule 2: arbitrary coded symbols of the first coded TFCI symbols and the second coded TFCI symbols are mapped to $d_{30}(b_{30})$ and $d_{31}(b_{31})$.

Rule 3: two arbitrary coded symbols output from an encoder with an increased coding rate are mapped to $d_{30}(b_{30})$ and $d_{31}(b_{31})$.

Rule 4: two arbitrary coded symbols output from an encoder with a high coding rate are mapped to $d_{30}(b_{30})$ and $d_{31}(b_{31})$.

Rule 5: two arbitrary coded symbols output from an encoder other than the encoder with an increased coding rate are mapped to $d_{30}(b_{30})$ and $d_{31}(b_{31})$.

In applying Rule 1, Rule 2, Rule 3, Rule 4, and Rule 5, the following should be considered. That is, when one or two coded symbols among the coded symbols $c_x^1$ and $x_y^2$ of each code are not transmitted, it should be considered (1) how the performance of the code used for the first TFCI or the second TFCI will be changed, (2) which TFCI among the first TFCI and the second TFCI should be increased in reliability (or performance), (3) which coded symbols among the coded symbols $c_x^1$ and $x_y^2$ output from the respective encoders should be mapped to $d_{30}(b_{30})$ and $d_{31}(b_{31})$ to minimize performance degradation of the codes, and (4) which TFCI among the first TFCI and the second TFCI should be stressed during transmission.

In the following description of Rule 1, Rule 2, Rule 3, and Rule 5, it will be assumed that the information bit ratio of the first TFCI to the second TFCI is 3:7 in the HSM. Further, in the description of Rule 4, it will be assumed that the information bit ratio of the first TFCI to the second TFCI is 3:7 for condition A1.

A description of Rule 1 will be made below with reference to an example. A (9,3) code and a (23,7) code, or a (11,3) code and a (21,7) code are available according to the information bit ratio of the first TFCI to the second TFCI. The (9,3) code and the (23,7) code are used to increase code performance of the second TFCI, while the (11,3) code and the (21,7) code are used to increase code performance of the first TFCI. When Rule 1 is applied, the last coded symbol of the (9,3) code is not transmitted, so an actual coding rate of the (9,3) code becomes (8,3); the last coded symbol of the (23,7) code is not transmitted, so an actual coding rate of the (23,7) code becomes (22,7); the last coded symbol of the (11,3) code is not transmitted, so an actual coding rate of the (11,3) code becomes (10,3); and the last coded symbol of the (21,7) code is not transmitted, so an actual coding rate of the (21,7) code becomes (20,7). In Rule 1, the encoders map their last coded symbols to $d_{30}(b_{30})$ and $d_{31}(b_{31})$, contributing to simplification of the mapping. However, in condition A1, the actual coding rate of the first TFCI to the second TFCI is decreased, resulting in a reduction in code performance of the first TFCI and the second TFCI.

A description of Rule 2 will be made below with reference to an example. A (9,3) code and a (23,7) code, or a (11,3) code and a (21,7) code are available according to the information bit ratio of the first TFCI to the second TFCI. When Rule 2 is applied, an arbitrary coded symbol of the (9,3) code is not transmitted, so an actual coding rate of the (9,3) code becomes (8,3); an arbitrary coded symbol of the (23,7) code is not transmitted, so an actual coding rate of the (23,7) code becomes (22,7); an arbitrary coded symbol of the (11,3) code is not transmitted, so an actual coding rate of the (11,3) code becomes (10,3); and an arbitrary coded symbol of the (21,7)

code is not transmitted, so an actual coding rate of the (21,7) code becomes (20,7). The arbitrary coded symbols can be selected from the 4 codes such that the actual code performances are not decreased although the actual coding rates of the respective codes are decreased. However, several codes may decrease in performance regardless of the selected arbitrary coded symbols. Rule 2 is more complex than Rule 1 in a method of mapping the coded symbols $c_x^1$ and $c_y^2$. However, in condition A1, it is possible to maintain code performances of the first TFCI and the second TFCI regardless of the reduction in the actual coding rate of the encoders for the first TFCI and the second TFCI.

A description of Rule 3 will be made below with reference to an example. A (9,3) code and a (23,7) code, or a (11,3) code and a (21,7) code are available according to the information bit ratio of the first TFCI to the second TFCI. When Rule 3 is applied, two arbitrary coded symbols of the (23,7) code are not transmitted, so an actual coding rate of the (23,7) code becomes (21,7); and two arbitrary coded symbols of the (11, 3) code are not transmitted, so an actual coding rate of the (11,3) code becomes (9,3). The arbitrary coded symbols can be selected such that the actual code performances are not decreased although the actual coding rates of the respective codes are decreased. However, most of the codes decrease in performance. In Rule 3, the actual coding rate of the respective codes becomes (9,3) or (21,7), thus satisfying performance of the TFCI codewords with an actual data rate ⅓ for condition A1. However, the increase in number of the TFCI symbols causes a decrease in performance of the code for which the coded symbols have increased in number, although it was intended to increase performance of the first TFCI code or the second TFCI code. Rule 3 can search for the arbitrary symbols, which do not decrease the performance of the codes. Like Rule 2, Rule 3 also has a complex mapping method. In order to simplify the mapping method, the last two symbols among the coded symbols output from the encoder having the increased number of coded symbols are mapped to $d_{30}(b_{30})$ and $d_{31}(b_{31})$.

A description of Rule 4 will be made below with reference to an example. A (23,7) code and a (9,3) code, or a (21,7) code and a (11,3) code are available according to the information bit ratio of the first TFCI to the second TFCI. The (21,7) code and the (11,3) code are used to increase the coding rate of the second TFCI, while the (23,7) code and the (9,3) code are used to increase the coding rate of the first TFCI. When Rule 4 is applied, the last two coded symbols of the (23,7) code are not transmitted, so an actual coding rate of the (23,7) code becomes (21,7) and the coding rate of the (9,3) code remains unchanged; and the last two coded symbols of the (21,7) code are not transmitted, so an actual coding rate of the (21,7) code becomes (19,7) and the coding rate of the (11,3) code remains unchanged. When Rule 4 is applied, the last two symbols or arbitrary two symbols from the respective encoders having the large number of codewords are mapped to $d_{30}(b_{30})$ and $d_{31}(b_{31})$. In Rule 4, two coded symbols of the code having a longer codeword are not transmitted, so performance of the code having the longer codeword is reduced, but performance of the code having the shorter codeword is secured.

A description of Rule 5 will be made below with reference to an example. If it is assumed that the information bit rate of the first TFCI to the second TFCI is 3:7 and performance of the codeword transmitting the second TFCI is increased, then a (9,3) code and a (23,7) code are available. In Rule 5, in order to transmit the second TFCI at high reliability, two arbitrary coded symbols of the (9,3) code are mapped to $d_{30}(b_{30})$ and $d_{31}(b_{31})$, so the actual coding rate becomes (7,3). In Rule 5, performance of a first TFCI encoder is reduced, but coded symbols for the second TFCI are not damaged, so it is possible to safely transmit the second TFCI codeword.

In the foregoing description of Rule 1, Rule 2, Rule 3, and Rule 4, the $c_x^1$ and $c_y^2$ are mapped to the $b_l$ only in condition A1. However, in conditions A2, A3, and A4, all of the 32 coded symbols are transmitted or the 32 coded symbols are transmitted through repetition, so a separate mapping rule is not required and the intact mapping rules used for condition A1 can be used. In addition, Rule 1, Rule 2, Rule 3, Rule 4, and Rule 5 can be properly used according to circumstances.

Herein, the present invention will provide a method of mapping the $c_x^1$ and $c_y^2$ symbols to the $b_l$ bits by way of example. In the following example, the method applicable to Rule 1 and the method of arranging the first coded TFCI symbols and the second coded TFCI symbols as uniformly as possible to obtain a time transmission gain can also be applied to another mapping method. In condition A1, the last coded symbols of the $c_x^1$ and $c_y^2$ are mapped to the $b_{30}$ or $b_{31}$.

Of the encoders provided by the invention, the 16 encoders increasing the coding rate of the first TFCI encoder or the second TFCI encoder, though they have the coding rate ⅓, are designed to have optimal performance at the coding rate ⅓.

Before a description of the method of mapping the coded symbols $c_x^1$ and $c_y^2$ to the coded bits $b_l$, the number of the first coded TFCI symbols $c_x^1$ is defined as n (where n=x+1) and the number of the second coded TFCI symbols $c_y^2$ is defined as m (where m=y+1). For convenience of explanation, it will be assumed that n is equal to or smaller than m, and the sum of n and m becomes 32. Thus, for n=4, 7, 10, 13, and 16, m=28, 25, 22, 19 and 16, respectively. The values n and m are defined as $$b_{\left[\frac{32}{n} \times (i+1)\right]-1} = c_i^1, (0 \leq i \leq n-1) \quad (1)$$

$$b_{i+\left\lfloor \frac{n}{32-n} \times (i+\frac{1}{2}) \right\rfloor} = c_i^2, (0 \leq i \leq m-1) \quad (2)$$

In Equation (1), n indicates the total number of the first coded TFCI symbols, and i indicates indexes of the first coded TFCI symbols, wherein 0≦i≦n−1 (or x). The indexes are assigned in the order of generation. Equation (1) represents the positions of the $b_l$ bits to which the first coded TFCI symbols are to be mapped. In Equation (1), [x] indicates an integer obtained by rounding off a given value x.

In Equation (2), n indicates the total number of the first coded TFCI symbols, m indicates the total number of the second coded TFCI symbols, and i indicates indexes of the second coded TFCI symbols, wherein 0≦i≦m−1 (or y). The indexes are assigned in the order of generation. Equation (2) represents the positions of the $b_l$ bits to which the second coded TFCI symbols are to be mapped. In Equation (2), ⌊x⌋ indicates a maximum value among the integers smaller than or equal to a given value x.

The first coded TFCI symbols are mapped (arranged) according to Equation (1), while the second coded TFCI symbols are mapped according to Equation (2). As to the order of the coded symbols, either the first coded TFCI symbols or the second coded TFCI symbols can first be arranged. Alternatively, the first coded TFCI symbols and the second coded TFCI symbols can be simultaneously arranged.

When the number of the first coded TFCI symbols is larger than the number of the second coded TFCI symbols (n>m), Equation (2) is used to map the first coded TFCI symbols and Equation (1) is used to map the second coded TFCI symbols.

Table 6 below illustrates the coded symbols generated according to Equation (1) and Equation (2). In Table 6, '0' indicates the positions where the first coded TFCI symbols $c_x^1$ are transmitted, and '1' indicates the positions where the second coded TFCI symbols $c_y^2$ are transmitted.

TABLE 6

| Code | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 4,1 | 1 | 1 | 1 | 1 | 1 | 1 | 1 | 0 | 1 | 1 | 1 | 1 | 1 | 1 | 0 | 1 | 1 | 1 | 1 | 1 | 1 | 0 | 1 | 1 | 1 | 1 | 1 | 1 | 1 | 1 | 1 | 0 |
| 7,2 | 1 | 1 | 1 | 0 | 1 | 1 | 1 | 1 | 0 | 1 | 1 | 0 | 1 | 1 | 1 | 1 | 0 | 1 | 1 | 1 | 0 | 1 | 1 | 1 | 1 | 0 | 1 | 1 | 1 | 1 | 1 | 0 |
| 10,3 | 1 | 1 | 0 | 1 | 1 | 0 | 1 | 1 | 0 | 1 | 1 | 0 | 1 | 1 | 1 | 0 | 1 | 1 | 0 | 1 | 1 | 1 | 0 | 1 | 1 | 0 | 1 | 1 | 0 | 1 | 1 | 0 |
| 13,4 | 1 | 0 | 1 | 0 | 1 | 1 | 0 | 1 | 0 | 1 | 1 | 0 | 1 | 0 | 1 | 1 | 0 | 1 | 0 | 1 | 1 | 0 | 1 | 0 | 1 | 1 | 0 | 1 | 0 | 1 | 1 | 0 |
| 16,5 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 |
| 19,6 | 0 | 1 | 0 | 1 | 0 | 0 | 1 | 0 | 1 | 0 | 0 | 1 | 0 | 1 | 0 | 0 | 1 | 0 | 1 | 0 | 0 | 1 | 0 | 1 | 0 | 0 | 1 | 0 | 1 | 0 | 0 | 1 |
| 22,7 | 0 | 0 | 1 | 0 | 0 | 1 | 0 | 0 | 1 | 0 | 0 | 1 | 0 | 0 | 0 | 1 | 0 | 0 | 1 | 0 | 0 | 1 | 0 | 0 | 1 | 0 | 0 | 1 | 0 | 0 | 0 | 1 |
| 25,8 | 0 | 0 | 0 | 1 | 0 | 0 | 0 | 0 | 1 | 0 | 0 | 0 | 1 | 0 | 0 | 0 | 0 | 1 | 0 | 0 | 0 | 1 | 0 | 0 | 0 | 0 | 1 | 0 | 0 | 0 | 0 | 1 |
| 28,9 | 0 | 0 | 0 | 0 | 0 | 0 | 0 | 1 | 0 | 0 | 0 | 0 | 0 | 0 | 1 | 0 | 0 | 0 | 0 | 0 | 0 | 0 | 1 | 0 | 0 | 0 | 0 | 0 | 0 | 0 | 0 | 1 |

Table 6 is an example of arranging the first coded TFCI symbols and the second coded TFCI symbols. In order to select the positions for transmitting the coded symbols generated in accordance with Table 6 over a physical channel, the different methods are used in conditions A1, A2, A3, and A4. In condition A1, the coded symbols $c_x^1$ and $c_y^2$ mapped to the bit $b_{30}$ or $b_{31}$ are punctured, and then 30 $b_l$ bits are mapped to the bits $d_m$ before being transmitted. In condition A2, the 32 $b_l$ bits mapped in condition A1 are sequentially repeated 3 times, repeated once more from $b_0$ to $b_{23}$, and then mapped to a total of 120 $d_m$ bits before being transmitted. In condition A3, the 32 $b_l$ bits arranged in condition A1 are mapped to the positions of the transmission bits $d_m$ before being transmitted. In condition A4, the 32 $b_l$ bits mapped in condition A1 are repeated 4 times, and then mapped to the positions of the 128 transmission bits $d_m$ before being transmitted.

Figure 6:
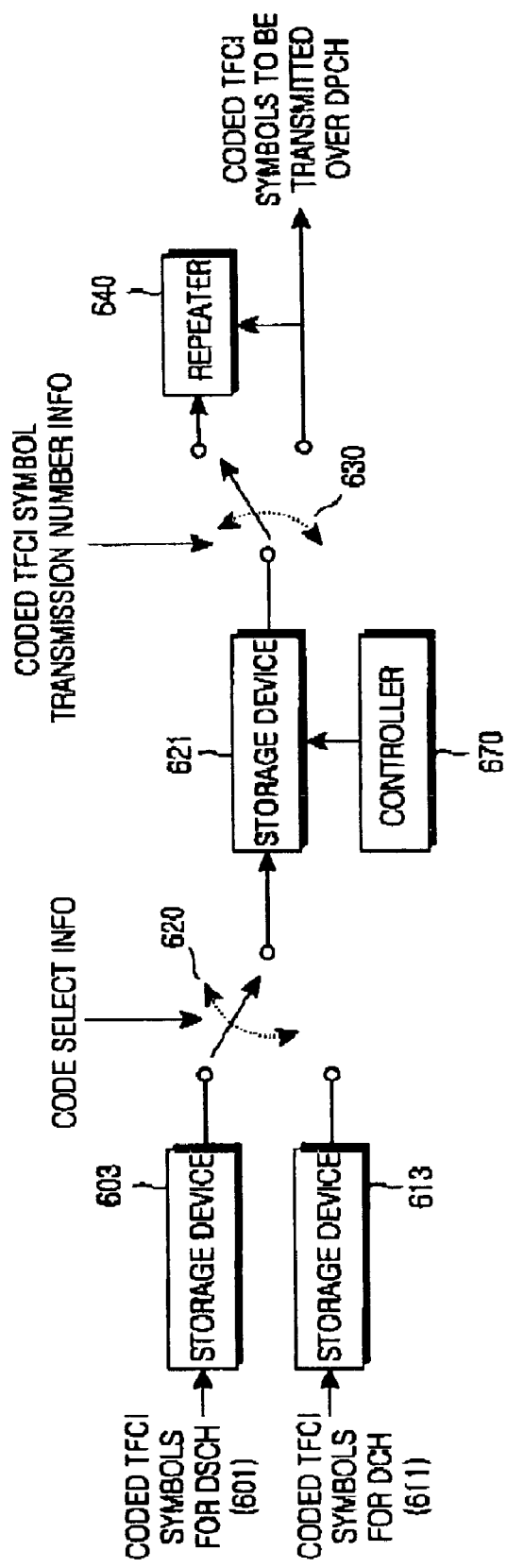
FIG. 6 illustrates a detailed structure of the symbol arranger illustrated in FIG. 2.

FIG. 6 illustrates a detailed structure of the coded symbol arranger 210 of FIG. 2. Referring to FIG. 6, reference numeral 601 indicates the second coded TFCI symbols $c_y^2$ output from the encoder 200 of FIG. 2, and reference numeral 611 indicates the first coded TFCI symbols $c_x^1$ output from the encoder 205. Storage devices 603 and 613 are devices for storing the coded symbols $c_x^1$ and $c_y^2$ and are realized using a memory. However, by modifying the hardware structure, it is possible to directly apply the second coded TFCI symbols 601 and the first coded TFCI symbols 611 to a switch 620 without storing the coded symbols in the storage devices. The switch 620 is alternately switched to the storage devices 603 and 613 according to code select information received. The coded symbols $c_x^1$ and $c_y^2$ output from the storage devices 603 and 613 are stored in a permanent storage device 621. A controller 670 arranges the received coded symbols $c_x^1$ and $c^{y2}$ in accordance with Table 6. The symbol arrangement can be realized by either hardware or software. A switch 630 switches the $b_l$ bits stored in the storage device 621 to an output node or a repeater 640 according to information on the number of the coded TFCI symbols, i.e., information on the $d_m$ bits. That is, in condition A1 or A3 where the number of $d_m$ bits is 30 or 32, the switch 630 switches the $b_l$ bits from the storage device 621 to the output node. In conditions A2 or A4 where the number of $d_m$ bits is 120 or 128, the switch 630 switches the $b_l$ bits from the storage device 621 to the repeater 640. The repeater 640 repeats the bits $b_l$ from the switch 630 a predetermined number of times in order to obtain the bits $d_m$ for conditions A2 or A4. The repeater 640 is enabled in the conditions A2 and A4. The repeater 640 can also be realized by software in the controller 670.

Figure 5:
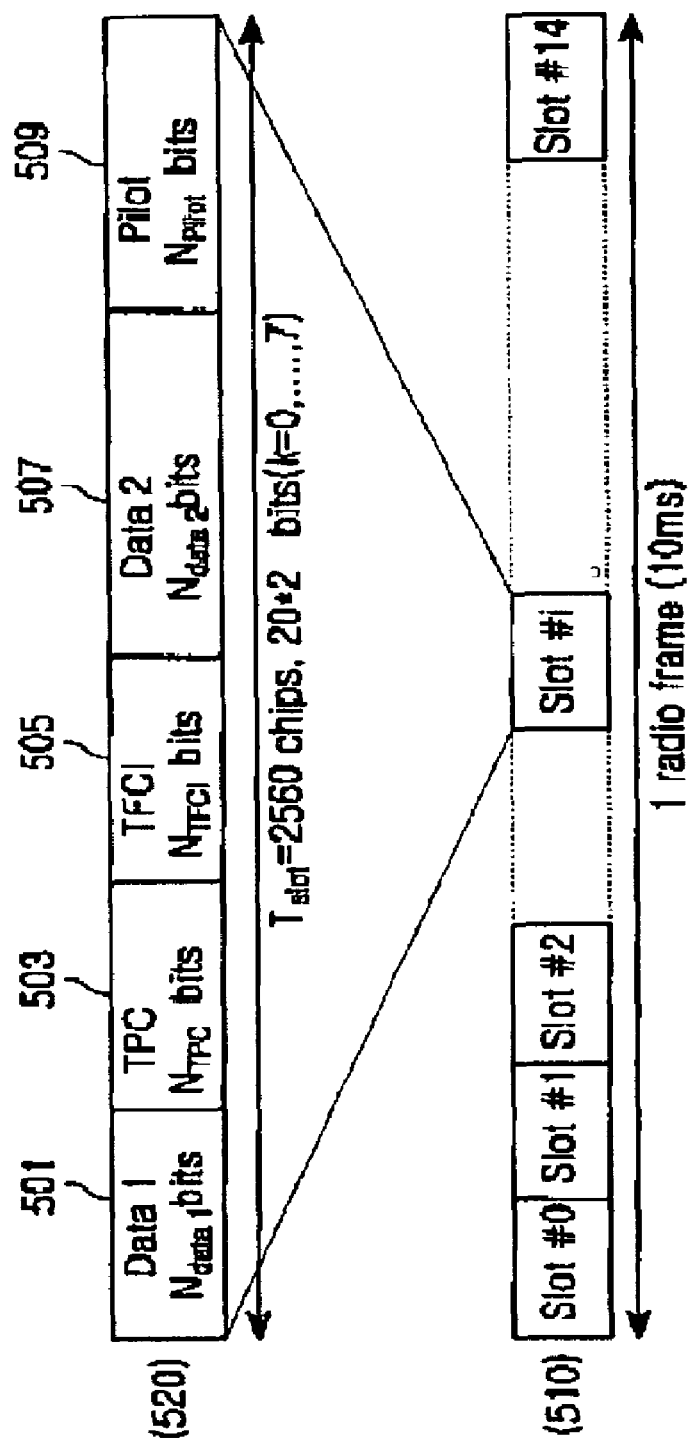
FIG. 5 illustrates a structure of a downlink radio frame transmitted from a Node B to a UE.

The $b_l$ bits arranged by the coded symbol arranger 210 in accordance with Table 6 are provided to a multiplexer 220, where they are time-multiplexed with physical information such as the TPC bits and Pilot bits transmitted over DPCCH, and DPDCH. The multiplexer 220 generates DPCH, the structure of which is illustrated in FIG. 5. FIG. 5 illustrates a structure of the DPCH transmitted from a Node B to a UE.

Referring to FIG. 5, reference numeral 510 represents a structure of a radio frame comprised of 15 time slots. Reference numeral 520 represents a structure of a time slot of a downlink channel in which DPDCH and DPCCH are separated on a time-division basis. That is, the time slot is comprised of two data fields 501 and 507 constituting the DPDCH, and a TPC field 503, a TFCI field 505 and a Pilot field 509 constituting the DPCCH. The TPC field 503 is used to transmit a TPC command for an uplink channel from the UE to the Node B, and the Pilot field 509 is used to estimate a change in the uplink channel and signal strength by the UE. Further, the TFCI field 505 is used to transmit the coded TFCI transmission symbols $d_m$ output from the coded symbol arranger 210 to the UE.

The DPCH output from the multiplexer 220 is provided to a spreader 230, and at the same time, a spreading code for channel separation is provided from a spreading code generator 235 to the spreader 230. The spreader 230 channel-spreads the DPCH by the spreading code in a symbol unit, and outputs the channel-spread DPCH in a chip unit. The channel-spread DPCH is provided to a scrambler 240, and at the same time, a scrambling code is provided from a scrambling code generator 245 to the scrambler 240. The scrambler 240 scrambles the channel-spread DPCH with the scrambling code.

2. Second Embodiment of Transmitter

Figure 13:
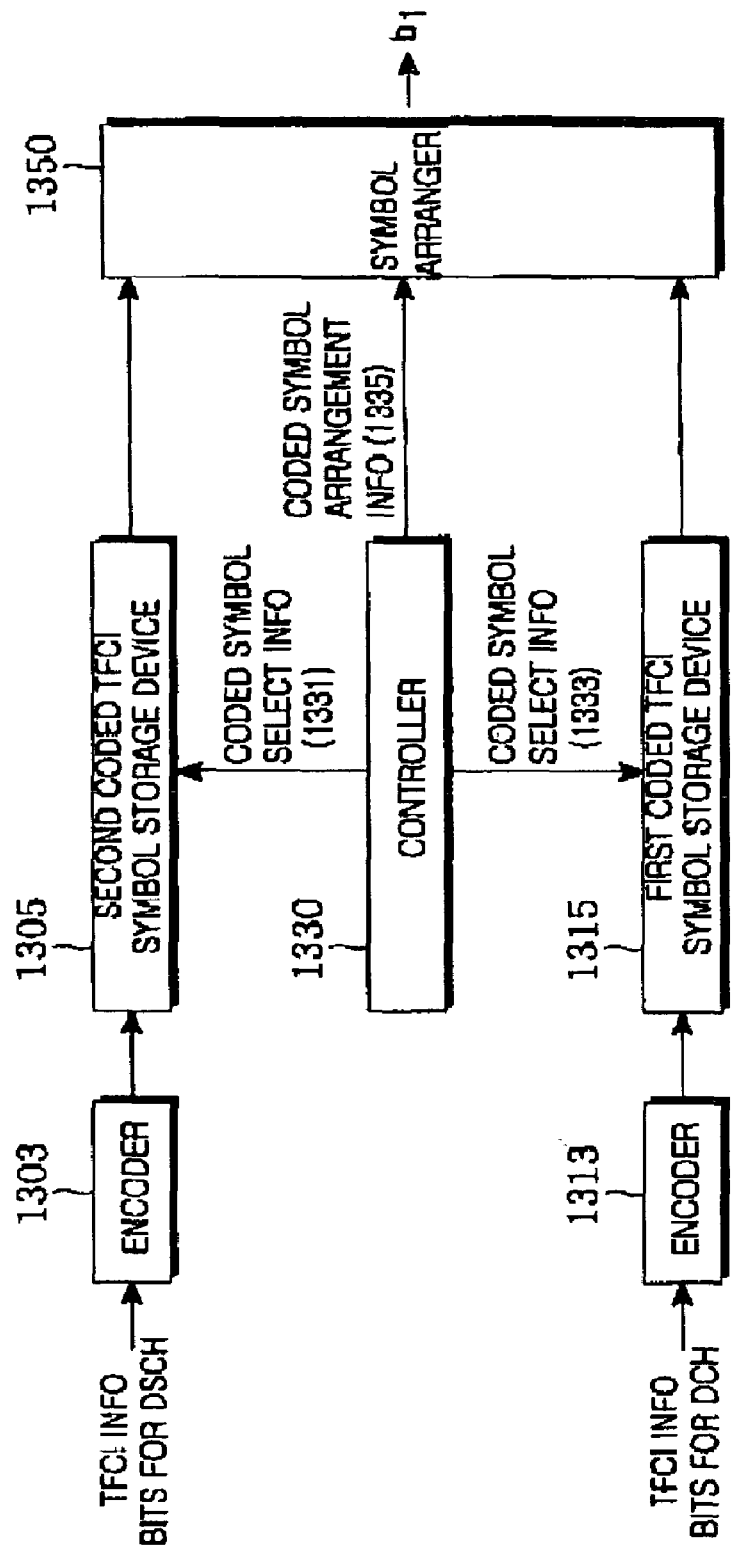
FIG. 13 illustrates another connection between encoders and a symbol arranger according to an embodiment of the present invention.

FIG. 13 illustrates a structure of a transmitter according to a second embodiment of the present invention. Referring to FIG. 13, an encoder 1303 and an encoder 1313 encode TFCI information bits for the DSCH (second TFCI information bits) and TFCI information bits for the DCH (first TFCI information bits), respectively. The encoder 1303 and the encoder 1313 are equal in structure to the encoder illustrated in FIG. 4, except that the puncturer and the controller are not provided. The 32 coded symbols output from the encoder 1303 are provided to a second coded TFCI symbol storage device 1305, and the 32 coded symbols output from the encoder 1313 are provided to a first coded TFCI symbol storage device 1315. The first coded TFCI symbol storage device 1315 and the second coded TFCI symbol storage device 1305 can share the same memory. In this case, the first coded TFCI symbols and the second coded TFCI symbols must be logically distinguishable. The second coded TFCI symbol storage device 1305 and the first coded TFCI symbol storage device 1315 provide a symbol arranger 1350 with the coded symbols among the 32 coded symbols stored therein, selected according to second coded symbol select information 1331 and first coded symbol select information 1333 received from a controller 1330, respectively. The second coded symbol select information 1331 and the first coded symbol select information 1333 are the same information as the puncturing pattern illustrated in Table 5, and used to select desired coded symbols among the 32 coded symbols instead of puncturing the coded symbols according to the puncturing pattern. The outputs of the second coded TFCI symbol storage device 1305 and the first coded TFCI symbol storage device 1315 are equal to $c_y^2$ and $c_x^1$, respectively. The symbol arranger 1350 arranges the second coded TFCI symbols and the first coded TFCI symbols received in the form of Table 6, according to coded symbol arrangement information 1335 received from the controller 1330. An output of the symbol arranger 1350 becomes $b_l$. The controller 1330 of FIG. 13 controls the symbol storage devices 1305 and 1315 and the symbol arranger 1350 according to the symbol puncturing pattern of Table 5 and the symbol arrangement pattern of Table 6, respectively, to provide the same output as that of the encoder and the symbol selector illustrated in FIGS. 4, 6, and 8.

Figure 19:
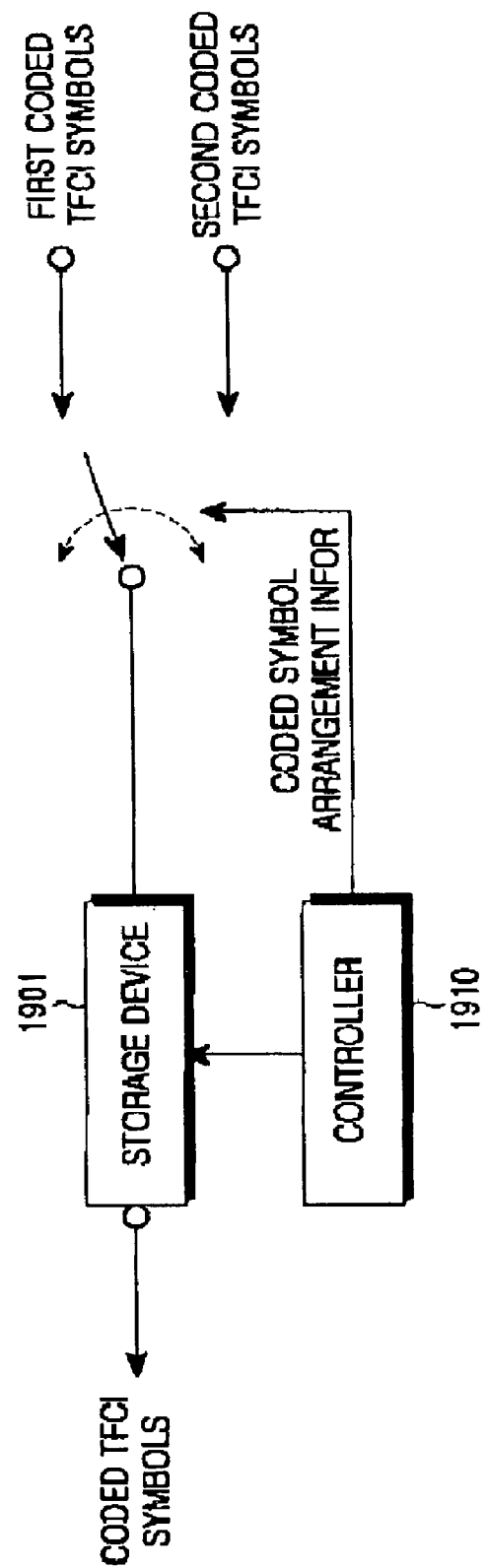
FIG. 19 illustrates a structure of a coded symbol arranger according to an embodiment of the present invention.

FIG. 19 illustrates a detailed structure of the coded symbol arranger 1350. Referring to FIG. 19, the coded symbol arranger is comprised of a storage device 1901, a controller 1910, and a switch. The storage device 1901, a device for storing the first coded TFCI symbols and the second coded TFCI symbols in the form of Table 6, arranges the first coded TFCI symbols and the second coded TFCI symbols under the control of the controller 1910, and then sequentially outputs the $b_l$ bits. The controller 1910 controls the switch to provide the storage device 1901 with the first coded TFCI symbols and the second coded TFCI symbols, and also controls the storage device 1901 to rearrange the first controller 1910 of FIG. 19 can be realized by software. In this case, the software can become an address controller. Alternatively, the symbol arranger 1350, the first coded TFCI symbol storage device 1315 and the second coded TFCI symbol storage device 1305 can be realized either in the same memory, or in different memories. However, when realized by software, the controller 1330 controls addresses on the memories of the symbol arranger 1350, the first coded TFCI symbol storage device 1315 and the second coded TFCI symbol storage device 1305, thereby performing the operation of the encoders and the symbol arranger by software.

3. Third Embodiment of Transmitter

FIG. 3 illustrates a structure of a transmitter according to a third embodiment of the present invention. The transmitter encodes the first coded TFCI symbols and the second coded TFCI symbols using a single encoder.

Figure 7:
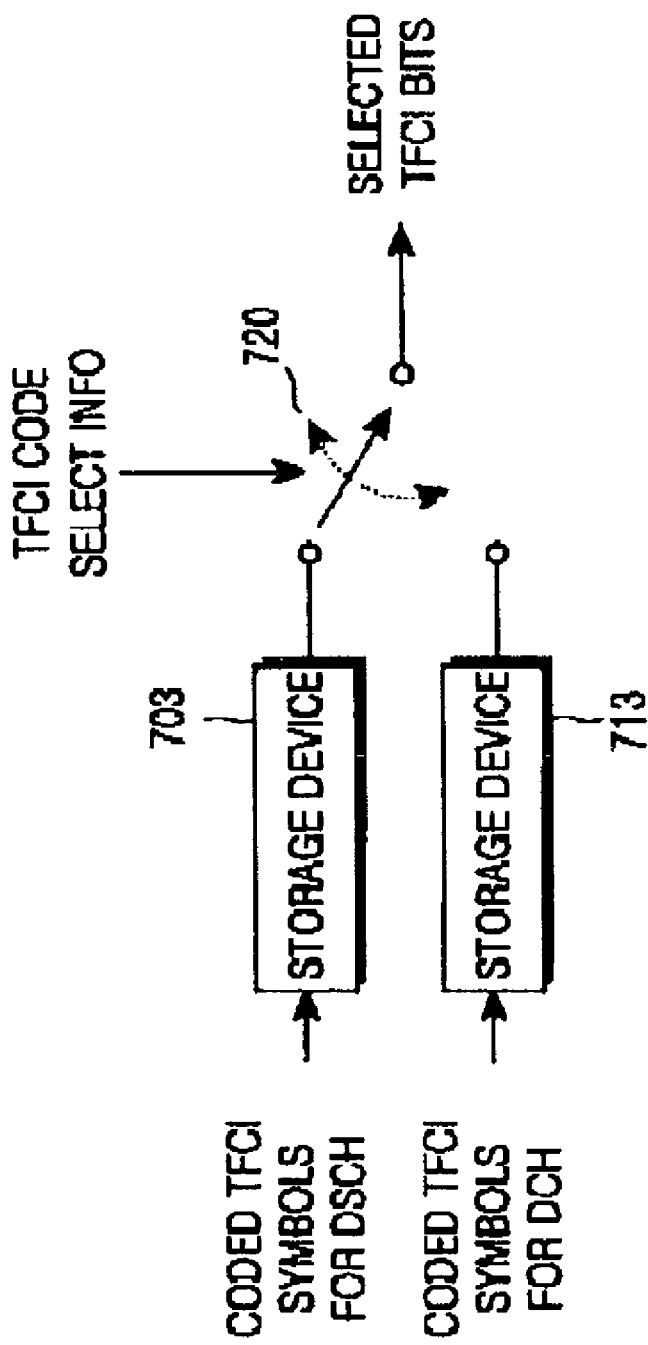
FIG. 7 illustrates a detailed structure of the selector illustrated in FIG. 3.

Referring to FIG. 3, second coded TFCI bits 301 and first coded TFCI bits 303 are applied to a selector 310. The selector 310 selectively provides an encoder 311 with the second coded TFCI bits 301 or the first coded TFCI bits 303 according to TFCI select information from a controller 330. A detailed structure of the selector 310 is illustrated in FIG. 7, by way of example. Referring to FIG. 7, the second TFCI bits 301 are provided to a storage device 703 and the first TFCI bits 303 are provided to a storage device 713. The storage devices 703 and 713, devices for storing the second TFCI bits 301 and the first TFCI bits 303, can be realized by memories. However, by modifying the hardware structure, it is possible to directly apply the second TFCI bits 301 and the first TFCI bits 303 to a switch 720 without using the storage devices. The switch 720 is alternately switched to the storage devices 703 and 713 according to code select information received. The second TFCI bits and the first TFCI bits output from the switch 720 are provided to the encoder 311. The selector 310 can also be realized by software.

The encoder 311 has the structure of FIG. 4, and encodes the TFCI bits from the selector 310 according to code length information received from the controller 330. The controller 330 can also be realized by software.

The coded symbols $c_x^1$ or $c_y^2$ output from the encoder 311 are provided to a symbol arranger 312, where they are arranged in the form illustrated in Table 6. An internal structure of the symbol arranger 312 is illustrated in FIG. 8.

Figure 8:
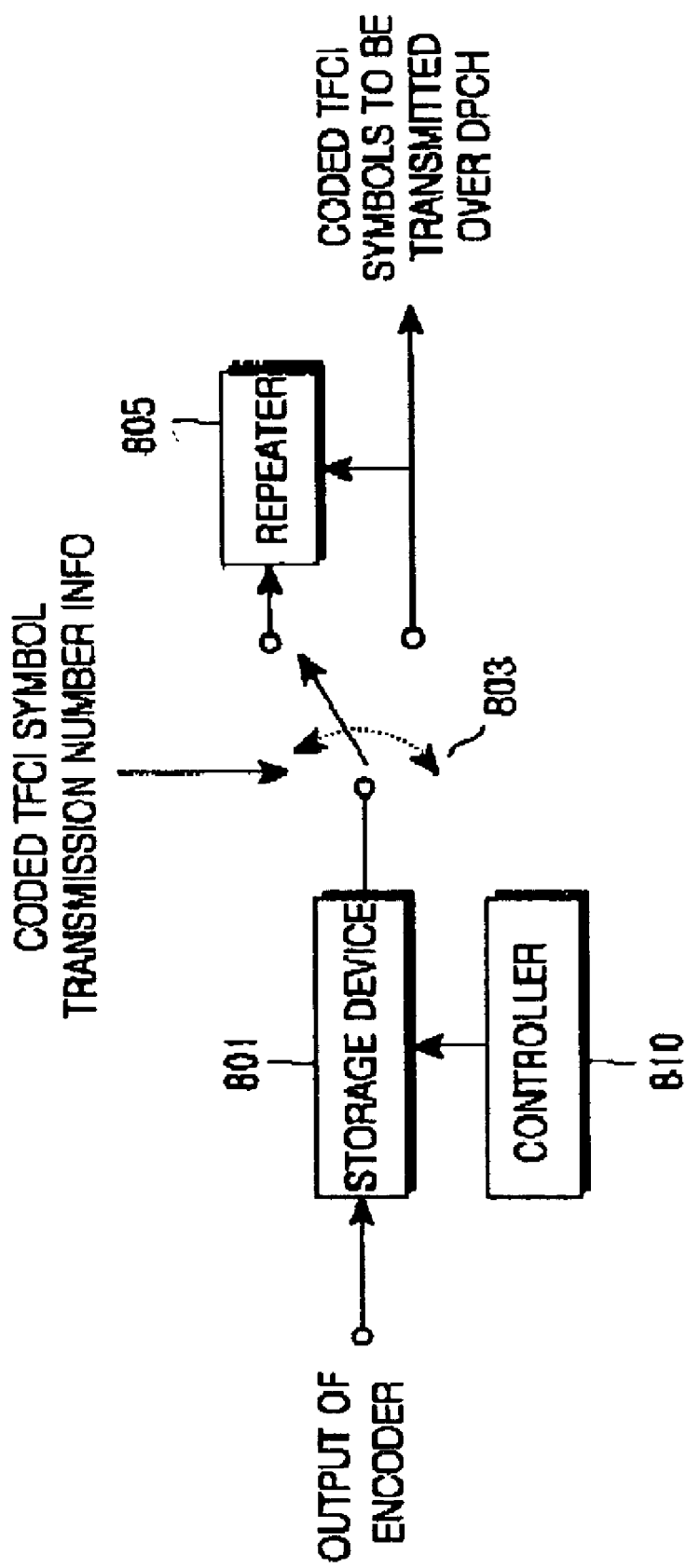
FIG. 8 illustrates another detailed structure of the symbol arranger illustrated in FIG. 3.

Referring to FIG. 8, a storage device 801 arranges the received coded TFCI symbols in the form illustrated in Table 6 under the control of a controller 810. Of the coded symbols $c_x^1$ or $c_y^2$, the first received coded TFCI symbols are stored in the storage device 801 until the other coded TFCI symbols are completely arranged. The storage device 801 provides a switch 803 with $b_l$ bits. The switch 803 outputs the intact coded TFCI symbols from the storage device 801 or outputs the coded TFCI symbols to a repeater 805, according to information on the number of coded TFCI symbol transmissions. The repeater 805 repeats the coded TFCI symbols provided from the switch 803 as many times as the number of the coded TFCI symbols $d_m$ to be transmitted over the physical channel. The repeater 805 can be realized to perform the same operation by software. The repeater 805 can be realized as either an internal block of the controller 810 or a separate block.

The coded TFCI symbols $d_m$ output from the symbol arranger 312 are applied to a multiplexer 313, where they are time-multiplexed with the physical information such as TPC and Pilot bits transmitted over the DPCCH, and the DPDCH. The multiplexed DPCH has the structure illustrated in FIG. 5.

The DPCH is provided to a spreader 314, and at the same time, a spreading code generated by a spreading code generator 316 is provided to the spreader 314. The spreader 314 channel-spreads the DPCH by the spreading code in a symbol unit for channel separation, and outputs the channel-spread DPCH in a chip unit. The channel-spread DPCH is provided to a scrambler 315, and at the same time, a scrambling code generated by a scrambling code generator 317 is provided to the scrambler 315. The scrambler 315 scrambles the channel-spread DPCH with the scrambling code.

4. Fourth Embodiment of Transmitter

Figure 14:
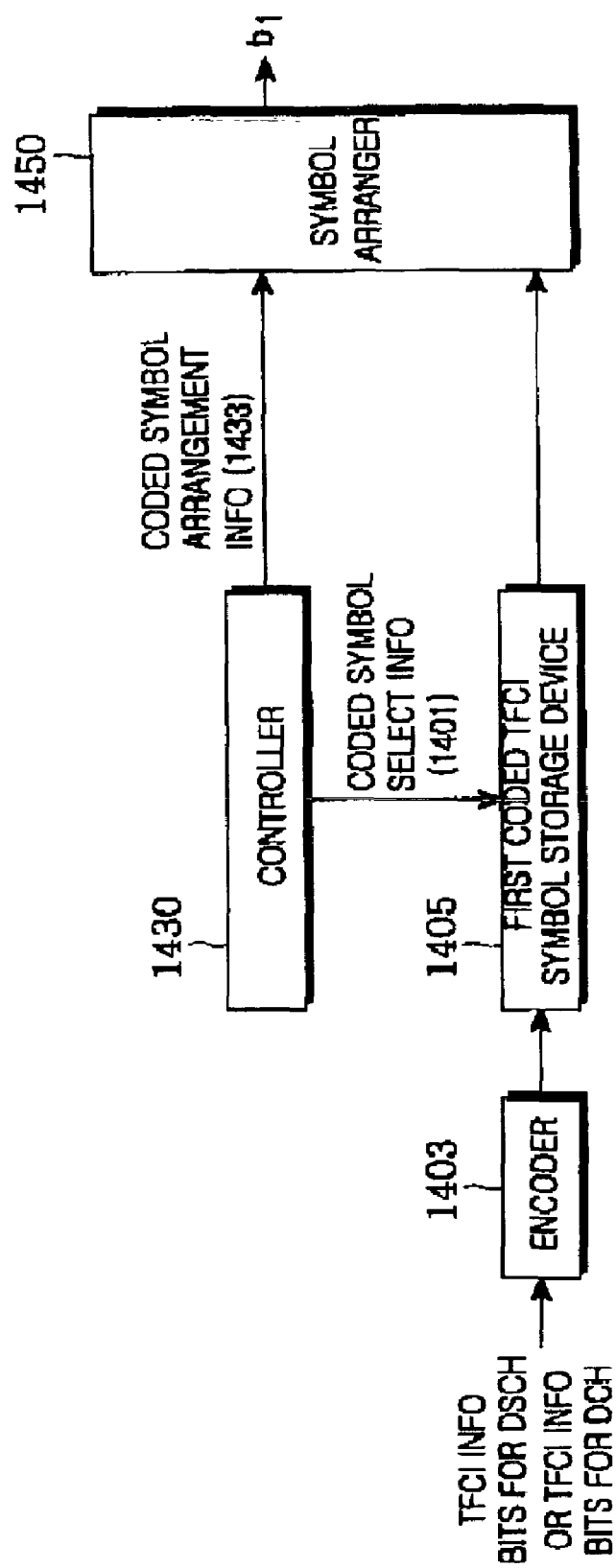
FIG. 14 illustrates yet another connection between an encoder and a symbol arranger according to an embodiment of the present invention.

FIG. 14 illustrates a structure of a transmitter according to a fourth embodiment of the present invention. The transmitter of FIG. 14 is different from the transmitter of FIG. 13 in that an encoder sequentially encodes the first TFCI information bits and the second TFCI information bits using a single encoder. Referring to FIG. 14, first TFCI information bits or second TFCI information bits are provided to an encoder 1403, where they are encoded and then provided to a coded symbol storage device 1405. The coded symbol storage device 1405 selects the coded symbols according to coded symbol select information 1401, i.e., the puncturing pattern of Table 5, received from a controller 1430, and provides the selected coded symbols to a code selector (or code arranger) 1450. The coded symbol storage device 1405 can directly provide the selected first coded TFCI symbols or second coded TFCI symbols to the code arranger 1450. Alternatively, the encoder 1403 receives the other coded TFCI symbols, and the coded symbol storage device 1405 selects the received coded TFCI symbols according to the coded symbol select information 1401 from the controller 1430 and provides the two types of the coded TFCI symbols to the code arranger 1450. The code selector 1450 of FIG. 14 maps the coded symbols $c_x^1$ and $c_y^2$ received in the form of Table 6 to the bits $b_l$. Also, the coded symbol storage device, the code arranger, and the controller can be realized by software.

5. Fifth Embodiment of Transmitter

Figure 15:
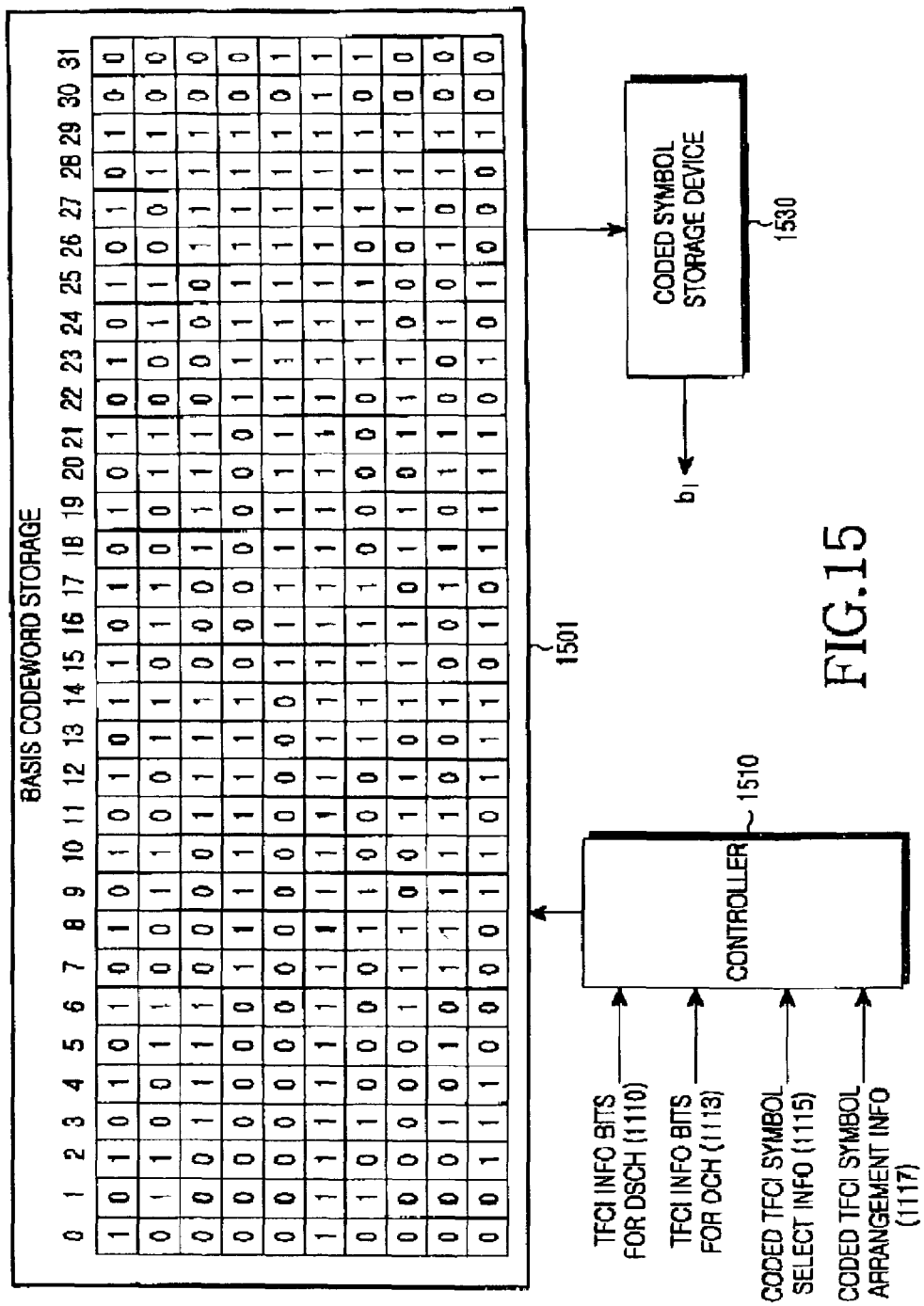
FIG. 15 illustrates further another connection between an encoder and a symbol arranger according to an embodiment of the present invention.

FIG. 15 illustrates a structure of a transmitter according to a fifth embodiment of the present invention. Unlike the other transmitters, the transmitter of FIG. 15 simultaneously performs TFCI encoding and symbol arrangement.

An operation of the transmitter will be described with reference to an example where the second TFCI bits are encoded at a rate of (4,1), the first TFCI bits are encoded at a rate of (28,9), and the coded symbols are arranged to the bits $b_i$.

Referring to FIG. 15, a basis codeword storage 1501 stores the basis codewords W1, W2, W4, W8, W16, M1, M2, M4, M8, and all-1's sequence, used in the encoder of FIG. 4. In the basis codeword storage 1501, a horizontal axis represents the basis codewords of length 32, and a vertical axis represents symbols of the respective basis codewords. A controller 1510 receives second TFCI information bits 1511, first TFCI information bits 1513, coded TFCI symbol select information 1515, and coded TFCI symbol arrangement information 1517, controls the basis codeword storage 1501 to generate a (4,1) code and a (28,9) code, and arranges the codes to obtain a time transmission gain.

If the second TFCI information bits 1511 are defined as $a_0^2$ and the first TFCI information bits are defined as $a_0^1, a_1^1, a_2^1, a_3^1, a_4^1, a_5^1, a_6^1, a_7^1$ and $a_8^1$, the controller 1510 repeats 4 times an operation of generating 7 first coded TFCI symbols and 1 second coded TFCI symbol according to the coded TFCI symbol arrangement information 1517 of Table 6, i.e., $c_0^1, c_1^1, c_2^1, c_3^1, c_4^1, c_5^1, c_6^1, c_7^1, c_8^1, c_9^1, c_{10}^1, c_{11}^1, c_{12}^1, c_{13}^1, c_{14}^1, c_{15}^1, c_{16}^1, c_{17}^1, c_{18}^1, c_{19}^1, c_{20}^1, c_{21}^1, c_{22}^1, c_{23}^1, c_{24}^1, c_{25}^1, c_{26}^1, c_{27}^1$, and $c_3^2$.

The first coded TFCI symbols and the second coded TFCI symbols use different basis codewords according to the received TFCI information bits $a_0^1, a_1^1, a_2^1, a_3^1, a_4^1, a_5^1, a_6^1, a_7^1, a_8^1$, and $a_0^2$. The use of the selected basis codewords is determined according to whether the input information bits are '0' or '1', and the symbols are selected according to the puncturing pattern of Table 5.

Nine first TFCI input bits are received for the first coded TFCI symbols, so the basis codeword generator 1501 generates the basis codewords W1, W2, W4, W8, W16, an all-1's sequence, M1, M2 and M4. One second TFCI input bit is received for the second coded TFCI symbols, so the basis codeword generator 1501 generates only the basis codeword W1. The first coded TFCI symbols have a puncturing pattern of {1,1,1,1,1,1,0,1,1,1,0,0,1,0,1,1,1,1,1,1,1,1,1,1,1,1,1,1,1,1,1,1}, and the second coded TFCI symbols have a puncturing pattern of {1,0,1,0,1,0,1,0,0,0,0,0,0,0,0,0,0,0,0,0,0,0,0,0,0,0,0,0,0,0,0,0}.

To generate the second coded TFCI symbols, the basis codeword storage 1501 selects $0^{th}, 2^{nd}, 4^{th}$, and $6^{th}$ symbols of the basis codeword W1. To generate the first coded TFCI symbols, the basis codeword storage 1501 XORs the basis codewords W1, W2, W4, W8, W16, all-1's sequence, M1, M2, and M4, and then selects the symbols other than the $6^{th}, 10^{th}, 11^{th}$, and $13^{th}$ symbols of the resulting codeword.

The operations of the TFCI encoder and the symbol arranger of FIG. 15 have been described with reference to an example of simultaneously generating the (4,1) code and the (28,9) code. Also, another method of generating different types of the codewords has a process of selecting the type of the basis codeword to be used according to the number of the input code bits, and determining the order of generating the coded symbols using the coded symbol arrangement pattern of Table 6. Further, the method has a process of XORing the basis codewords according to the order and values of the input code bits, and selecting the coded symbols according to the puncturing pattern of Table 5. A coded symbol storage device 1530 stores the values output from the basis codeword storage 1501. Like the transmitter illustrated in FIGS. 13 and 14, the transmitter of FIG. 15 can also be realized by software.

6. First Embodiment of Receiver

Figure 9:
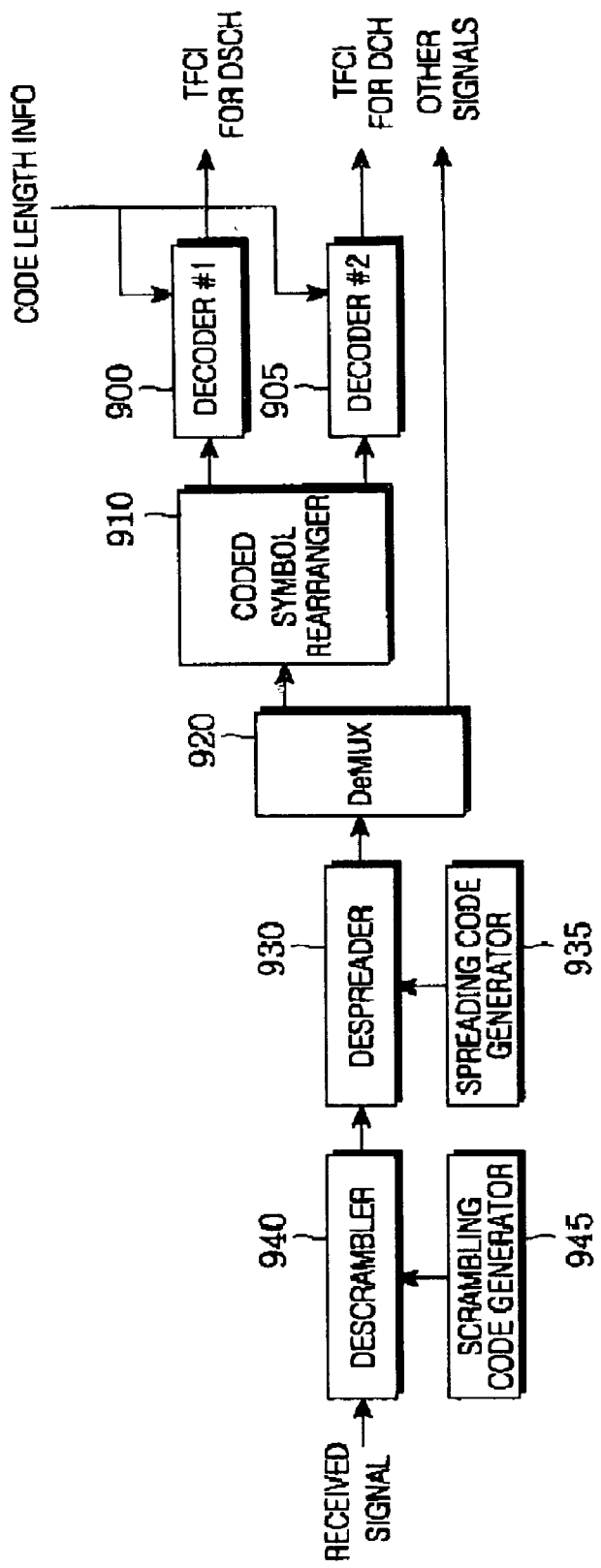
FIG. 9 illustrates a structure of a UE receiver according to an embodiment of the present invention.

FIG. 9 illustrates a structure of a receiver, corresponding to the transmitters illustrated in FIGS. 3 and 4, according to an embodiment of the present invention. Referring to FIG. 9, a downlink DPCH is provided to a descrambler 940, and at the same time, a scrambling code generated by a scrambling code generator 945 is provided to the descrambler 940. The descrambler 940 descrambles the downlink DPCH with the scrambling code. The descrambled downlink DPCH is provided to a despreader 930, and at the same time, a spreading code generated by a spreading code generator 935 is provided to the despreader 930. The despreader 930 despreads the descrambled downlink DPCH by the spreading code in a symbol unit.

The despread DPCH symbols are provided to a demultiplexer 920, where they are demultiplexed (separated) into coded TFCI symbols and other signals such as the DPDCH, TPC, and Pilot bits. The coded TFCI symbols are provided to a coded symbol rearranger 910. The coded symbol rearranger 910 separates the coded TFCI symbols into the coded symbols for DSCH (second TFCI information symbols) and the coded symbols for DCH (first TFCI information symbols) according to code length information and position information. The code length information is code length control information based on a ratio of the TFCI bits for the DSCH to the TFCI bits for the DCH. The position information is information indicating positions of the coded symbols for the DSCH and positions of the coded symbols for the DCH, illustrated in Table 6. The second coded TFCI symbols and the first coded TFCI symbols separated by the coded symbol rearranger 910 are provided to a first decoder 900 and a second decoder 905, respectively. The decoders 900 and 905 determine corresponding codes according to the code length information, and decode the second coded TFCI symbols and the first coded TFCI symbols by the determined codes, respectively. That is, the first decoder 900 decodes the second coded TFCI symbols and outputs second TFCI bits (TFCI bits for the DSCH), and the second decoder 905 decodes the first coded TFCI symbols and outputs first TFCI bits (TFCI bits for the DCH).

Figure 18A:
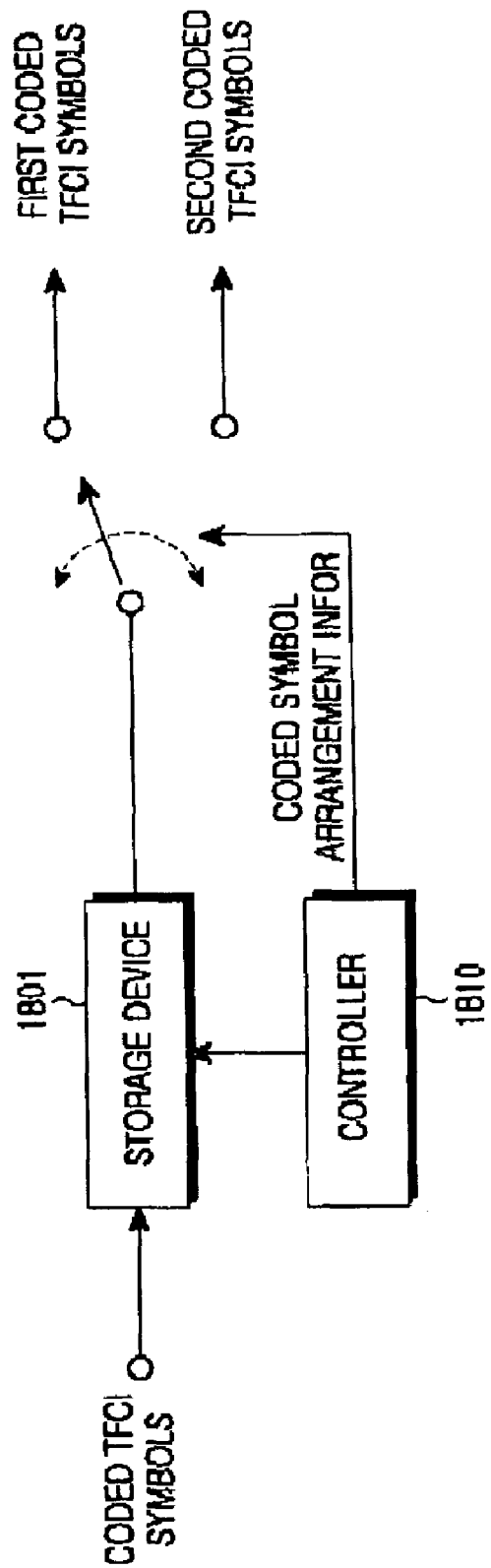
FIGS. 18A and 18B illustrate two different structures of a symbol arranger according to an embodiment of the present invention.
Figure 18B:
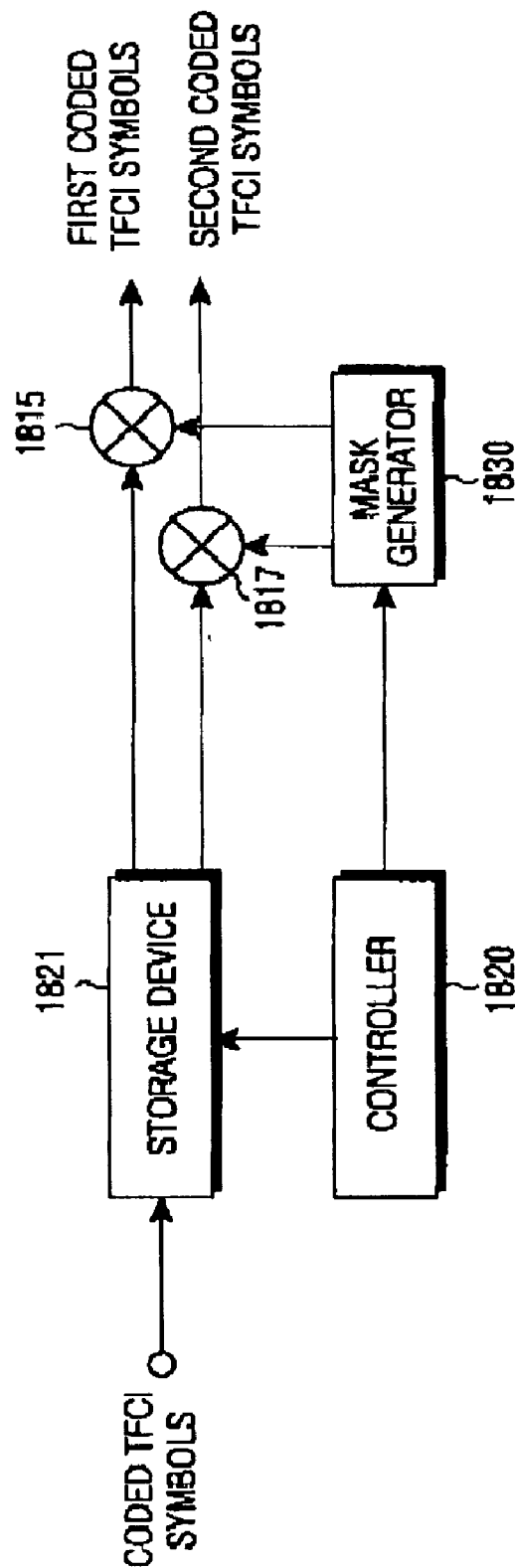

FIGS. 18A and 18B illustrate a detailed structure of the coded symbol rearranger 910 according to different embodiments of the present invention. Referring to FIG. 18A, the coded symbol rearranger is comprised of a storage device 1801, a controller 1810, and a switch. The storage device 1801, a device for storing the coded TFCI symbols received from the demultiplexer 920, separates the first coded TFCI symbols and the second coded TFCI symbols under the control of the controller 1810. The controller 1810 controls the storage device 1801 and the switch to provide the first coded TFCI symbols and the second coded TFCI symbols to decoders 905 and 900, respectively. Alternatively, when a single decoder is used, the controller 1810 separately provides the two types of the coded TFCI symbols to the single decoder. The controller 1810 can be realized by software. In this case, the software can become an address controller.

Referring to FIG. 18B, the coded symbol rearranger is comprised of a storage device 1821, a controller 1820, a mask generator 1830, a multiplier 1815 and a multiplier 1817. The storage device 1821 has the same operation as the storage device 1801 illustrated in FIG. 18A. The controller 1820 controls the storage device 1821 to provide the coded TFCI symbols from the demultiplexer 920 to the first multiplier 1815 and the second multiplier 1817. Further, the controller 1820 controls the mask generator 1830 to generate masks for separating the first coded TFCI symbols and the second coded TFCI symbols. The masks generated by the mask generator 1830 are provided to the first multiplier 1815 and the second multiplier 1817. The first multiplier 1815 multiplies the coded TFCI symbols from the storage device 1821 by the corresponding mask and outputs the first coded TFCI symbols. The second multiplier 1817 multiplies the coded TFCI symbols from the storage device 1821 by the corresponding mask and outputs the second coded TFCI symbols. The mask generator 1830 either stores the symbol arrangement pattern of the first coded TFCI symbols and the second coded TFCI symbols, illustrated in Table 6, in the form of a mask, or generates the masks using Equations (1) and (2). The masks are used to separate the coded TFCI symbols from the demultiplexer 920 into the first coded TFCI symbols and the second coded TFCI symbols. If each of the multiplier 1815 and the multiplier 1817 can output the two types of the coded TFCI symbols, only one of the two multipliers is used to separate the first coded TFCI symbols and the second coded TFCI symbols.

Figure 11:
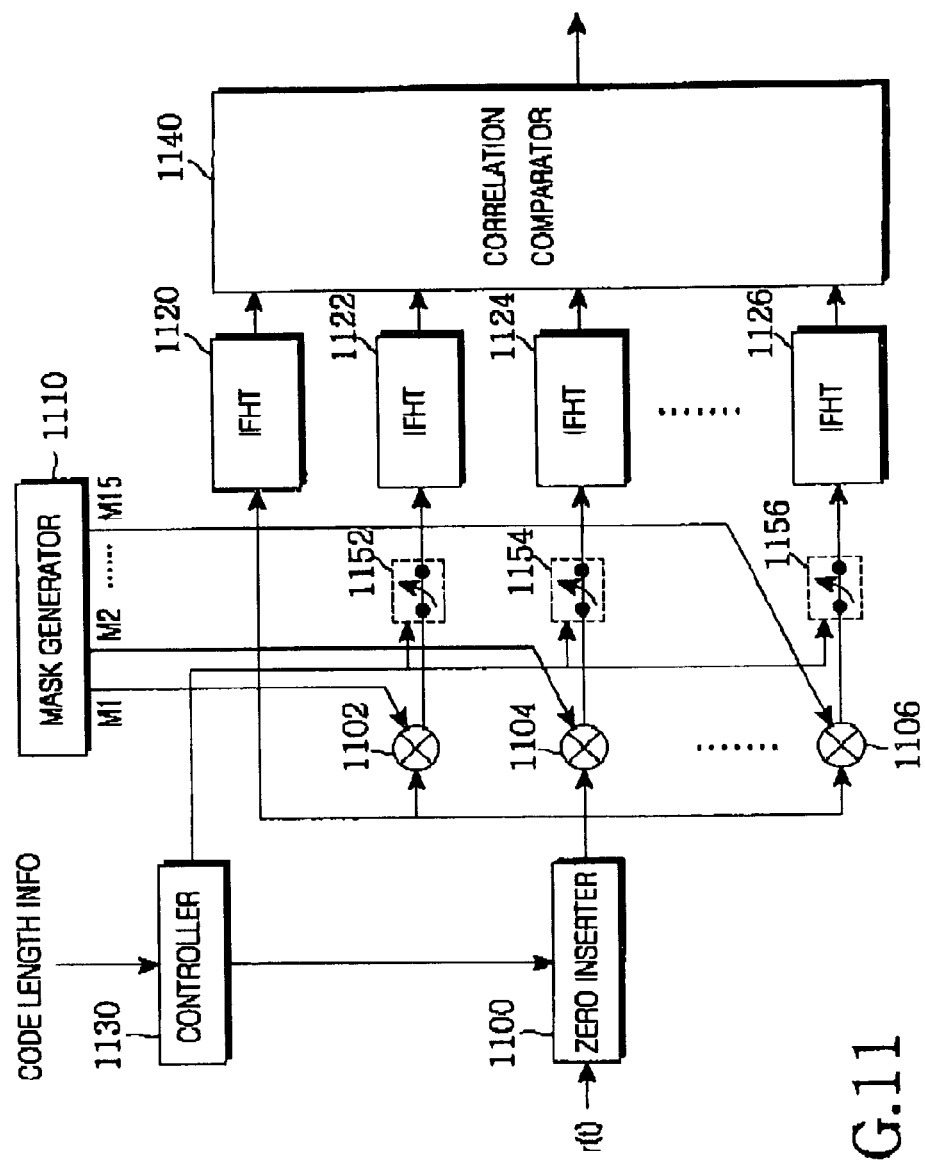
FIG. 11 illustrates a detailed structure of the decoder used in the receiver illustrated in FIG. 10.

FIG. 11 illustrates a detailed structure of the decoders 900 and 905 illustrated in FIG. 9. Referring to FIG. 11, received symbols r(t) are provided to a zero inserter 1100, and at the same time, code length information is provided to a controller 1130. The controller 1130 determines puncturing positions based on the code length information, and provides control information for the determined puncturing positions to the zero inserter 1100. The code length information indicates the code length or the coding rate used in the encoder, while the control information indicates the puncturing positions. The puncturing positions represent the positions of the symbols pruned to obtain a desired coded symbol length corresponding to the bits received from the encoder. Table 7 illustrates the puncturing positions stored in association with the code lengths.

TABLE 7

| Code Length Info (Coding Rate) | Puncturing Position |
|---|---|
| (3, 1) | F_29 |
| (4, 1) | F_28 |
| (5, 1) | F_27 |
| (6, 2) | F_26 |
| (7, 2) | F_25 |
| (8, 2) | F_24 |
| (9, 3) | F_23 |
| (10, 3) | F_22 |
| (11, 9) | F_21 |
| (12, 4) | F_20 |
| (13, 4) | F_19 |
| (14, 4) | F_18 |
| (18, 6) | F_14 |
| (19, 6) | F_13 |
| (20, 6) | F_12 |
| (21, 7) | F_11 |
| (22, 7) | F_10 |
| (23, 7) | F_9 |
| (24, 8) | F_8 |
| (25, 8) | F_7 |
| (26, 8) | F_6 |
| (27, 9) | F_5 |
| (28, 9) | F_4 |
| (29, 9) | F_3 |

It is assumed in Table 7 that the code length information indicates the coding rate used in the encoder. As a coding rate (k,n) indicates that n input bits are coded into k symbols, the received symbols have a coding length k. Further, F_n of Table 7 represents n puncturing positions. As can be determined from Table 11, the control information (puncturing position) enables the zero inserter 1100 to maintain the number (32) of output symbols regardless of the code length of the received symbols.

Referring to Table 7, the controller 1130 outputs information on 29 puncturing positions for a coding rate (3,1), information on 28 puncturing positions for a coding rate (4,1), information on 27 puncturing positions for a coding rate (5,1), information on 26 puncturing positions for a coding rate (6,2), information on 25 puncturing positions for a coding rate (7,2), information on 24 puncturing positions for a coding rate (8,2), information on 23 puncturing positions for a coding rate (9,3), information on 22 puncturing positions for a coding rate (10,3), information on 21 puncturing positions for a coding rate (11,9), information on 20 puncturing positions for a coding rate (12,4), information on 19 puncturing positions for a coding rate (13,4), information on 18 puncturing positions for a coding rate (14,4), information on 14 puncturing positions for a coding rate (18,6), information on 13 puncturing positions for a coding rate (19,6), information on 12 puncturing positions for a coding rate (20,6), information on 11 puncturing positions for a coding rate (21,7), information on 10 puncturing positions for a coding rate (22,7), information on 9 puncturing positions for a coding rate (23,7), information on 8 puncturing positions for a coding rate (24,8), information on 7 puncturing positions for a coding rate (25,8), information on 6 puncturing positions for a coding rate (26,8), information on 5 puncturing positions for a coding rate (27,9), information on 4 puncturing positions for a coding rate (28,9), and information on 3 puncturing positions for a coding rate (29,9). For the respective cases, the puncturing positions are the same as given in the description of the encoders.

The zero inserter 1100 inserts 0's in the puncturing positions of the received symbols according to the control information, and then outputs a symbol stream of length 32. The symbol stream is provided to an inverse fast Hadamard transformer (IFHT) 1120 and multipliers 1102, 1104, and 1106. The symbol stream provided to the multipliers 1102, 1104, and 1106 are multiplied by mask functions M1, M2, and M15 generated from the mask generator 1110, respectively. The output symbols of the multipliers 1102, 1104, and 1106 are provided to switches 1152, 1154, and 1156, respectively. At this moment, the controller 1130 provides the switches 1152, 1154, and 1156 with switch control information indicating use/nonuse of the mask functions based on the code length information. For example, as (3,1), (4,1), (5,1), (6,2), (7,2), (8,2), (9,3), (10,3), (11,3), (12,4), (13,4), (14,4), (18,6), (19, 6), and (20,6) encoders do not use the mask functions, the switches 1152, 1154, and 1156 are all disconnected according to the switch control information. However, as (21,7), (22,7) and (23,7) encoders use one basis mask function, only the switch 1152 is connected. In this manner, the controller 1130 controls the switches 1152, 1154, and 1156 according to the number of the mask functions used based on the coding rate. Then, the IFHTs 1120, 1122, 1124, and 1126 each perform inverse fast Hadamard transform on 32 symbols received from the zero inserter 1100, and calculate correlations between the symbols and all the Walsh codes that can be used in the transmitter. Further, the IFHTs determine a highest correlation among the correlations, and an index of the Walsh code having the highest correlation. Therefore, the IFHTs 1120, 1122, 1124, and 1126 each provide the correlation comparator 1140 with an index of the mask function multiplied by the received signal, the highest correlation, and an index of the Walsh code having the highest correlation. Since the signal provided to the IFHT 1120 is multiplied by none of the mask functions, an identifier of the mask function becomes '0'. The correlation comparator 1140 determines the highest correlation by comparing the correlations provided from the IFHTs, and combines an index of a mask function having the highest correlation with an index of the Walsh code.

7. Second Embodiment of Receiver

Figure 10:
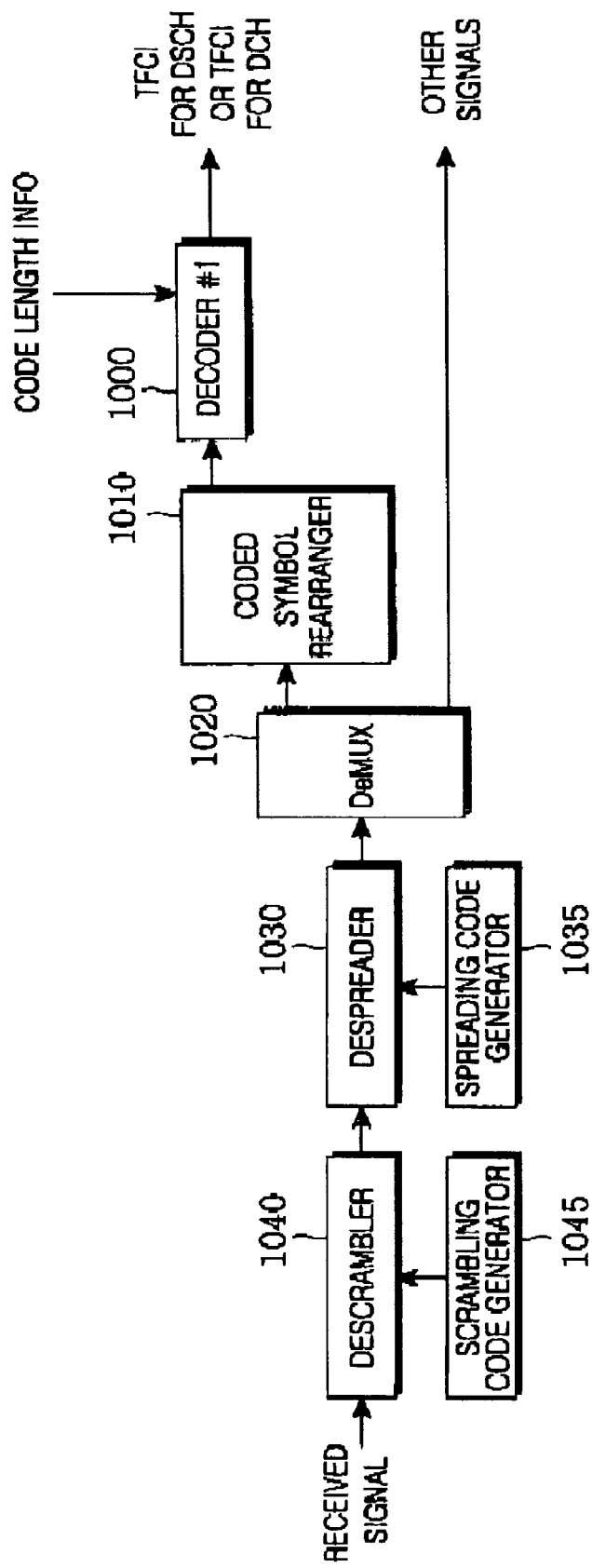
FIG. 10 illustrates another structure of a UE receiver according to another embodiment of the present invention.

FIG. 10 illustrates a structure of a receiver, corresponding to the transmitters illustrated in FIGS. 3 and 4, according to another embodiment of the present invention. Referring to FIG. 10, a downlink DPCH is provided to a descrambler 1040, and at the same time, a scrambling code generated by a scrambling code generator 1045 is provided to the descrambler 1040. The descrambler 1040 descrambles the downlink DPCH with the scrambling code. The descrambled downlink DPCH is provided to a despreader 1030, and at the same time, a spreading code generated by a spreading code generator 1035 is provided to the despreader 1030. The despreader 1030 despreads the descrambled downlink DPCH by the spreading code in a symbol unit.

The despread DPCH symbols are provided to a demultiplexer 1020, where they are demultiplexed (separated) into coded TFCI symbols and other signals such as the DPDCH, TPC, and Pilot bits. The coded TFCI symbols are provided to a coded symbol rearranger 1010. The coded symbol rearranger 1010 separates the coded TFCI symbols into the coded symbols for DSCH (second TFCI information symbols) and the coded symbols for DCH (first TFCI information symbols) according to code length information and position information. The code length information is code length control information based on a ratio of the TFCI bits for the DSCH to the TFCI bits for the DCH. The position information is information indicating positions of the coded symbols for the DSCH and positions of the coded symbols for the DCH, illustrated in Table 6.

The coded symbol rearranger 1010 has either structure as illustrated in FIGS. 18A and 18B. When using either structure of FIGS. 18A and 18B, the coded symbol rearranger 1010 should separately sequentially output the first coded TFCI symbols and the second coded TFCI symbols. The separated second coded TFCI symbols and first coded TFCI symbols are sequentially provided to a decoder 1000. The decoder 1000 decodes the first coded TFCI symbols or the second coded TFCI symbols by a code corresponding to the control information (code length information) for the code length. Therefore, the decoder 1000 outputs the first TFCI bits or the second TFCI bits. The decoder 1000 has the same operation as the decoder illustrated in FIG. 11.

Further, the present invention provides a decoder capable of performing decoding for the respective information bit ratios, which corresponds to the encoder for encoding the codes with the various lengths.

Now, an operation of the decoder according to an embodiment of the present invention will be described in detail herein below. When serving as a decoder corresponding to the (6,2), (7,2) and (8,2) encoders, the decoder uses IFHTs for a Walsh encoder with a length 4. When serving as a decoder corresponding to the (9,3), (10,3) and (11,3) encoders, the decoder uses IFHTs for a Walsh encoder with a length 8. When serving as a decoder corresponding to the (12,4), (13,4) and (14,4) encoders, the decoder uses IFHTs for a Walsh encoder with a length 16. When serving as a decoder corresponding to the (16,5) encoder, the decoder uses IFHTs for a Walsh encoder with a length 16. When serving as a decoder corresponding to the (18,6), (19,6), (20,6), (21,7), (22,7), (23,7), (24,8), (25,8), (26,8), (27,9), (28,9), (29,9), and (32,10) encoders, the decoder uses IFHTs for a Walsh encoder with a length 32. For this operation, the decoder should have an IFHT structure capable of supporting the codes with a variable length. Therefore, the present invention provides a decoder having the IFHT structure capable of supporting the codes with the variable length.

8. Operations of Embodiments

Operations of the encoder, the decoder, the symbol arranger, and the symbol rearranger will be described with reference to FIGS. 16 and 17.

Figure 16:
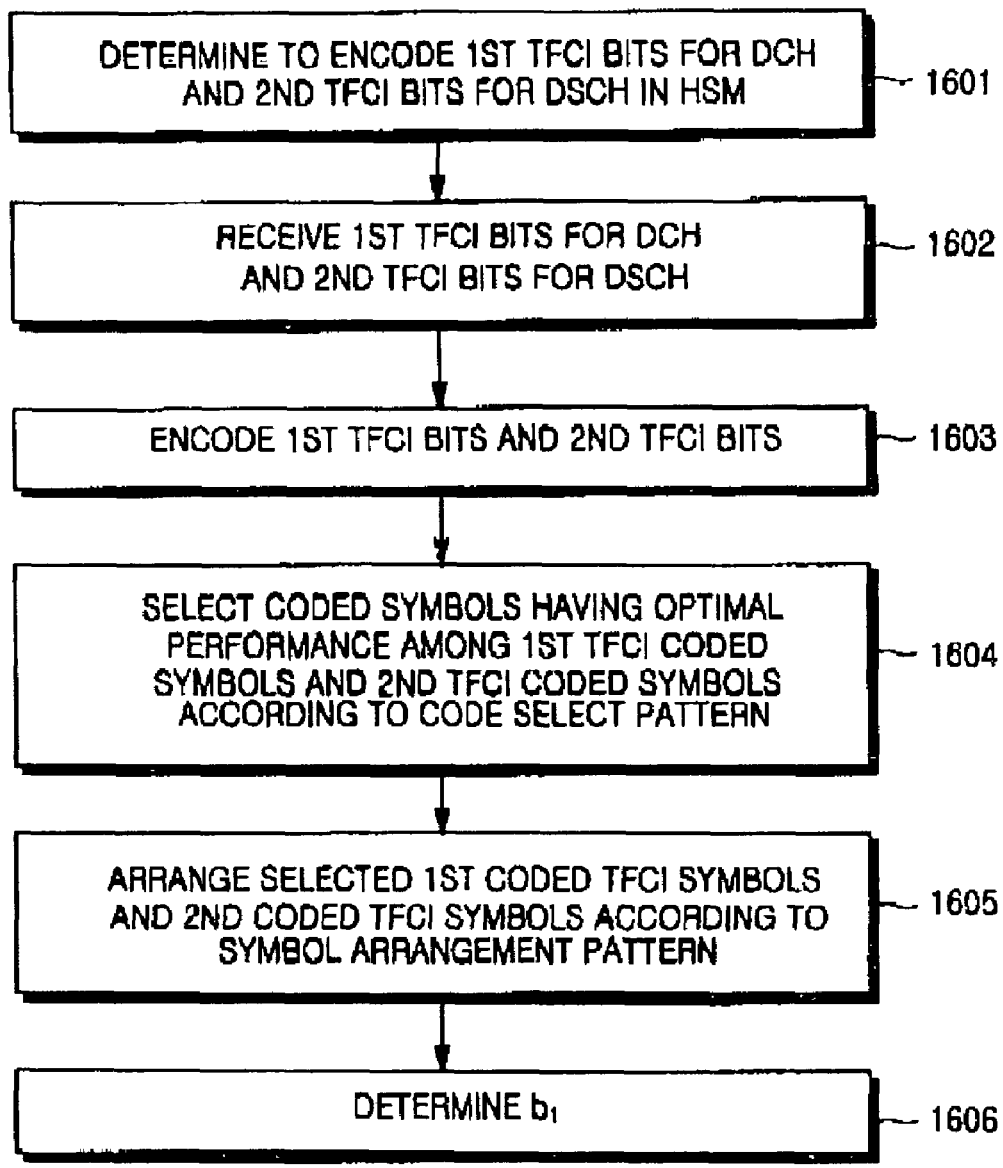
FIG. 16 illustrates an encoding operation according to an embodiment of the present invention.

FIG. 16 illustrates an operation of the encoder and the coded symbol arranger in the transmitter according to an embodiment of the present invention. Referring to FIG. 16, in step 1601, the transmitter decides to encode the first TFCI bits (TFCI information bits for the DCH) and the second TFCI bits (TFCI information bits for the DSCH) in the HSM (Hard Spilt Mode). In step 1602, the encoder receives the first coded TFCI bits and the second coded TFCI bits. In step 1603, the encoder encodes the first coded TFCI bits (32 coded symbols) and the second coded TFCI bits (32 coded symbols) in the method according to the present invention. In step 1604, the coded symbol arranger selects the coded symbols having optimal performance among the first coded TFCI symbols according to a code select pattern, and also selects the coded symbols having optimal performance among the second coded TFCI symbols according to a code select pattern. The code select patterns are equal to the puncturing patterns illustrated in Table 5. In step 1605, the coded symbol arranger arranges the selected first coded TFCI symbols and second coded TFCI symbols according to a symbol arrangement pattern for obtaining an optimal time diversity gain. The symbol arrangement pattern is illustrated in Table 6. As described in conjunction with FIG. 15, the operations of steps 1603, 1604, and 1605 can be performed in a single process. After step 1605, the $b_l$ bits are finally determined in step 1606, completing the encoding and symbol arrangement process.

Figure 17:
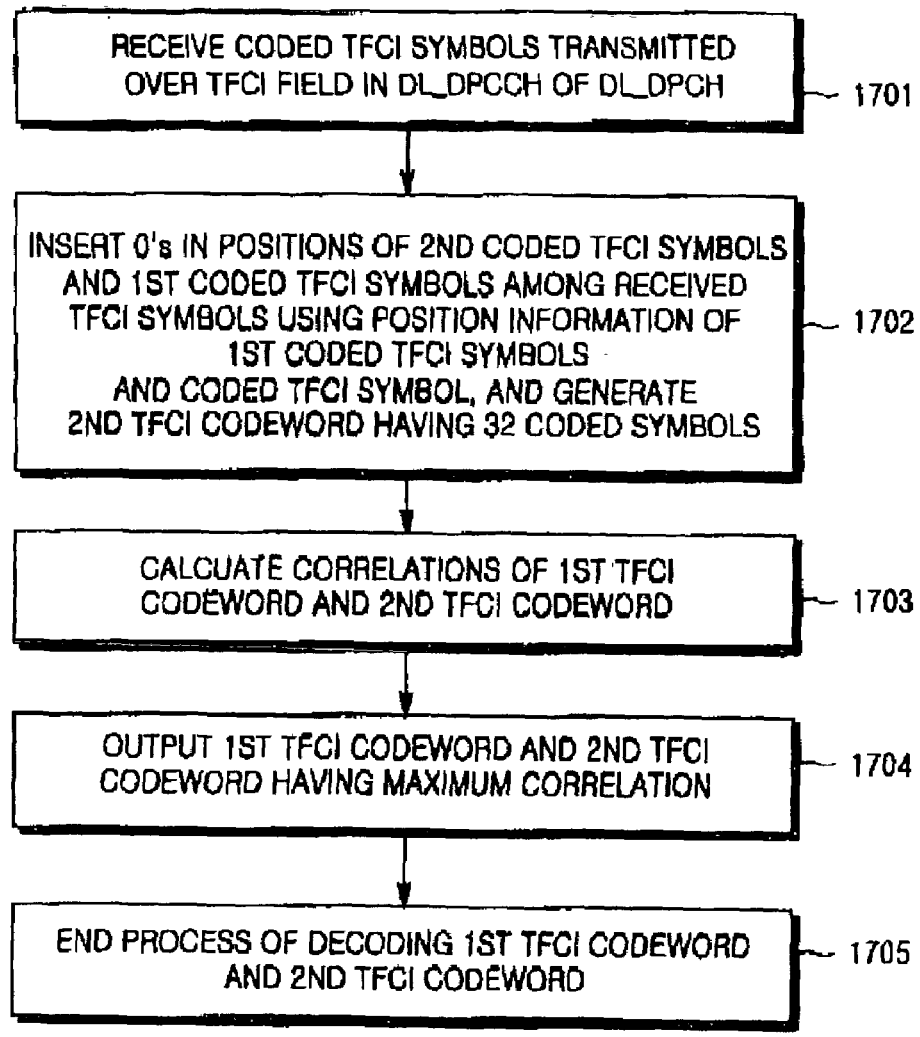
FIG. 17 illustrates a decoding operation according to an embodiment of the present invention.

FIG. 17 illustrates an operation of the decoder and the coded symbol rearranger in the receiver according to an embodiment of the present invention. Referring to FIG. 17, in step 1701, the receiver receives coded TFCI symbols transmitted over the TFCI field in the downlink DPCCH of the downlink DPCH. In step 1702, the decoder inserts 0's in the positions of the second coded TFCI symbols among the received coded TFCI symbols according to position information of the second coded TFCI symbols, and generates a first TFCI codeword having 32 coded symbols. Further, the decoder inserts 0's in the positions of the first coded TFCI symbols among the received coded TFCI symbols according to position information of the first coded TFCI symbols, and generates a second TFCI codeword having 32 coded symbols. As described in conjunction with FIGS. 18A and 18B, it is possible to separate the first coded TFCI symbols and the second coded TFCI symbols using the mask. The position information of the first coded TFCI symbols and the second coded TFCI symbols is equal to the pattern used in step 1604 of FIG. 16. The reason for inserting 0's in the positions of the non-punctured or unselected symbols is to secure a correct operation of the decoder. In step 1703, the decoder calculates correlations of the generated first TFCI codeword and second TFCI codeword. In step 1704, the decoder outputs values or indexes of the first TFCI codeword and the second TFCI codeword having the maximum correlation. In step 1705, the decoder ends the process of decoding the first TFCI codeword and the second TFCI codeword.

The foregoing description has been made for the decoding method, the method of mapping the $c_x^1$ and $c_y^2$ to the $b_l$ bits, and the method of mapping the $b_l$ bits to the $d_m$ bits, in the case where the sum of the number of the first TFCI information bits to the number of the second TFCI information bits in the HSM becomes 10. Further, the description has been made of the transceiver, the encoder and the decoder. Conventionally, if the sum of the number of the first TFCI information bits to the number of the second TFCI information bits is less than 10, the LSM is available but the HSM is not available. That is, the HSM is available, only when the number of the first TFCI information bits and the number of the second TFCI information bits are both less than 5. Conventionally, only the (16,5) encoder is used in the HSM. Therefore, the HSM is not available, when the number of the first TFCI information bits is larger than 5 or the number of the second TFCI information bits is larger than 5. However, when the novel encoder capable of generating 24 kinds of the codes according to the present invention is used, there is no restriction on the number of the TFCI information bits, thus making it possible to reliably transmit the TFCI information bits. That is, it is possible to determine the codes with which the TFCI information bits are to be encoded. Accordingly, it is possible to separately transmit the first TFCI code or the second TFCI code, or simultaneously transmit the first TFCI code and the second TFCI code, securing reliable transmission.

A detailed description of the invention will be made on the assumption that the encoder has the structure of FIG. 4 and uses the puncturing pattern of Table 4. The invention can also be applied to another case where the encoder has a different structure and uses a different puncturing pattern.

EX 1. Ratio of First TFCI Information Bits to Second TFCI Information Bits is 2:6

When the ratio of the first TFCI information bits to the second TFCI information bits is 2:6, the conventional HSM method can encode the first TFCI information bits before transmission, but cannot encode the second TFCI information bits. However, when the encoder according to the present invention is used, the first TFCI information bits are encoded into 6 symbols, 7 symbols, or 8 symbols, and the second TFCI information bits are encoded into 18 symbols, 19 symbols, or 20 symbols. The sum of the first coded TFCI symbols and the second coded TFCI symbols encoded by the encoder according to the present invention becomes a minimum of 24 and a maximum of 28. When the sum is less than 32, which is the basic number of the coded symbols, the simplest method of processing the symbols is to transmit only the 24 symbols or 28 symbols by discontinuous transmission (DTX). This method contributes to simplification, but cannot transmit other information in the DTX period, causing a waste of resources. In addition, it is not possible to increase coding performance of the first TFCI information bits and the second TFCI information bits due to the discontinuous transmission of the coded symbols.

In Ex 1, the coding method can be changed by giving priority to the first TFCI to increase reliability or performance, by giving priority to the second TFCI to increase reliability or performance, or by increasing performance of both the first TFCI and the second TFCI.

If priority is given to the first TFCI to increase reliability or performance, the second TFCI information bits are encoded using the (18,6) encoder, (19,6) encoder, or (20,6) encoder, and the first TFCI information bits are encoded using the (14,4) encoder, (13,4) encoder, or (12,4) encoder. Further, there is another method of encoding the first TFCI information bits by the (6,2) encoder, (7,2) encoder, or (8,2) encoder, and then repeatedly transmitting the first coded TFCI bits, thereby increasing the reliability of performance. In the method of increasing performance or reliability of the first TFCI code by encoding the first TFCI information bits using the (14,4) encoder, (13,4) encoder, or (12,4) encoder, 0's are inserted in the 2 bits excepting the 2 actual information bits before being encoded. After the repetition of the first TFCI, the sum of the repeated first coded TFCI symbols and the second coded TFCI symbols may exceed 32. If the sum of the first coded TFCI symbols and the second coded TFCI symbols exceeds 32, the system is not compatible with the 3GPP standard, thus increasing hardware complexity. In contrast, if the sum of the first TFCI information bits and the second TFCI information bits is less than 32 as in Ex 1, there is a less limitation on code selection when compared with the case where the sum of the first TFCI information bits and the second TFCI information bits is 10. That is, when the sum of the first TFCI information bits and the second TFCI information bits is 10, it is necessary to select the codes in which the sum of the coded symbols is 32. However, if the sum of the coded symbols is less than 32 although the maximum coding rate is used for the information bits given in Ex 1, the coding rate of the TFCI information bits can be determined such that performance is improved in a condition where the sum of the coded symbols becomes 32.

Meanwhile, if priority is given to the second TFCI in Ex 1 to increase the reliability or performance, the first TFCI information bits are encoded using the (6,2) encoder, (7,2) encoder, or (8,2) encoder, and the second TFCI information bits are encoded using the (26,8) encoder, (25,8) encoder, or (24,8) encoder. Alternatively, it is possible to encode the information bits using the (20,6) encoder, (19,6) encoder, or (18,6) encoder, and then repeatedly transmit the coded bits, thus to increase reliability or performance. After the repetition of the second TFCI, the sum of the first coded TFCI symbols and the repeated second coded TFCI symbols may exceed 32. However, if the sum of the first coded TFCI symbols and the second coded TFCI symbols exceeds 32, the system is not compatible with the 3GPP standard.

A method of increasing reliability or performance of both the first TFCI and the second TFCI in Ex 1 is to increase the number of the first TFCI information bits to 3 and the number of the second TFCI information bits to 7 before encoding. That is, the first TFCI information bits are encoded by the (9,3) encoder, (10,3) encoder, or (11,3) encoder, and the second TFCI information bits are encoded by the (23,7) encoder, (22,7) encoder, or (21,7) encoder before being transmitted. This method can be used only when the sum of the coded symbols does not exceed 32. When the sum of the coded symbols exceeds 32, the above-stated problem occurs. Another method is to encode the first TFCI information bits by the (6,2) encoder, (7,2) encoder, or (8,2) encoder, and the second TFCI information bits by the (18,6) encoder, (19,6) encoder, or (20,6) encoder, and then repeatedly transmit the coded bits. The sum of the repeatedly-transmitted coded symbols should not exceed 32. There are 3 kinds of encoders for encoding the first TFCI information bits, and there are also 3 kinds of encoders for encoding the second TFCI information bits. Of the encoders, the encoder having the best performance is selected. As to the number of the symbols repeated by the encoders, the symbols of the selected encoder are repeatedly-transmitted many more times.

EX 2. Ratio of First TFCI Information Bits to Second TFCI Information Bits is 3:4

When the ratio of the first TFCI information bits to the second TFCI information bits is 3:4, i.e., when the number of the first TFCI information bits and the number of the second TFCI information bits are both less than 5, the conventional HSM method (16,5)-encodes the first TFCI information bits and the second TFCI information bits separately or sequentially, before transmission. However, when the encoder according to the present invention is used, the first TFCI information bits are encoded into 9 symbols, 10 symbols or 11 symbols, and the second TFCI information bits are encoded into 12 symbols, 13 symbols or 14 symbols. The sum of the first coded TFCI symbols and the second coded TFCI symbols encoded by the encoder according to the present invention becomes a maximum of 25. When the sum is less than 32, which is the basic number of the coded symbols, the simplest method of processing the symbols is to transmit only the 21 symbols or 24 symbols by discontinuous transmission (DTX). This method contributes to simplification, but cannot transmit other information in the DTX period, causing a waste of resources. In addition, it is not possible to increase coding performance of the first TFCI information bits and the second TFCI information bits due to the discontinuous transmission of the coded symbols.

In Ex 2, the coding method can be changed by giving priority to the first TFCI to increase reliability or performance, by giving priority to the second TFCI to increase reliability or performance, or by increasing performance of both the first TFCI and the second TFCI.

If priority is given to the first TFCI to increase reliability or performance, the second TFCI information bits are encoded using the (12,4) encoder, the (13,4) encoder, or the (14,4) encoder, and the first TFCI information bits are encoded using the (20,6) encoder, the (19,6) encoder, or the (18,6) encoder. Further, there is another method of encoding the first TFCI information bits by the (9,3) encoder, the (10,3) encoder, or the (11,3) encoder, and then repeatedly transmitting the first coded TFCI bits, thereby increasing the reliability of performance. In the method of increasing performance or reliability of the first TFCI code by encoding the first TFCI information bits using the (20,6) encoder, the (19,6) encoder, or the (18,6) encoder, 0's are inserted in the 3 bits excepting the 3 actual information bits before being encoded. After the repetition of the first TFCI, the sum of the repeated first coded TFCI symbols and the second coded TFCI symbols may exceed 32. If the sum of the first coded TFCI symbols and the second coded TFCI symbols exceeds 32, the system is not compatible with the 3GPP standard, thus increasing hardware complexity. In contrast, if the sum of the first TFCI information bits and the second TFCI information bits is less than 32 as in Ex 2, there is a less limitation on code selection, compared with the case where the sum of the first TFCI information bits and the second TFCI information bits is 10. That is, when the sum of the first TFCI information bits and the second TFCI information bits is 10, it is necessary to select the codes in which the sum of the coded symbols is 32. However, if the sum of the coded symbols is less than 32 although the maximum coding rate is used for the information bits given in Ex 2, the coding rate of the TFCI information bits can be determined such that performance is improved in a condition where the sum of the coded symbols becomes 32.

Meanwhile, if priority is given to the second TFCI in Ex 2 to increase the reliability or performance, the first TFCI information bits are encoded using the (9,3) encoder, (10,3) encoder, or (11,3) encoder, and the second TFCI information bits are encoded using the (23,7) encoder, (22,7) encoder, or (21,7) encoder. Alternatively, it is possible to encode the information bits using the (14,4) encoder, (13,4) encoder, or (12,4) encoder, and then repeatedly transmit the coded bits, thus to increase reliability or performance. After the repetition of the second TFCI, the sum of the first coded TFCI symbols and the repeated second coded TFCI symbols may exceed 32. However, if the sum of the first coded TFCI symbols and the second coded TFCI symbols exceeds 32, the system is not compatible with the 3GPP standard.

Finally, a method of increasing reliability or performance of both the first TFCI and the second TFCI in Ex 2 is to increase the first TFCI information bits and the second TFCI information bits in number so that the sum of the first TFCI information bits and the second TFCI information bits becomes 10, and to use an encoder appropriate for the increased number of the information bits. For example, it is possible to use a method of encoding the first TFCI information bits by the (14,4) encoder, (13,4) encoder, or (12,4) encoder, and the second TFCI information bits by the (18,6) encoder, (19,6) encoder, or (20,6) encoder before transmission. This method can be used only when the sum of the first TFCI information bits and the second TFCI information bits should not exceed 10 and the sum of the coded symbols should not exceed 32. When the sum of the coded symbols exceeds 32, the above-stated problem occurs. Another method is to encode the first TFCI information bits by the (9,3) encoder, (10,3) encoder, or (11,3) encoder, and the second TFCI information bits by the (12,4) encoder, (13,4) encoder, or (14,4) encoder, and then repeatedly transmit the coded bits. The sum of the repeatedly-transmitted coded symbols should not exceed 32. There are 3 kinds of encoders for encoding the first TFCI information bits, and there are also 3 kinds of encoders for encoding the second TFCI information bits. Of the encoders, the encoder having the best performance is selected. As to the number of the symbols repeated by the encoders, the symbols of the selected encoder are repeatedly-transmitted many more times. In addition, it is possible to combine the coding rate changing method and the repeated transmission method, in transmitting the first TFCI information bits and the second TFCI information bits at high reliability or performance.

Criteria for the code selecting method in the HSM, described in conjunction with Ex 1 and Ex 2, will be summarized herein below.

Criterion 1: The number of first TFCI information bits or second TFCI information bits exceeds 5 bits If priority is given to the first TFCI, the transmitter fixes the second TFCI encoder and then changes a coding rate of the first TFCI during transmission, or encodes the first TFCI considering the number of actual information bits and then repeatedly-transmits the coded bits.

If priority is given to the second TFCI, the transmitter fixes the first TFCI encoder and then changes a coding rate of the second TFCI during transmission, or encodes the second TFCI considering the number of actual information bits and then repeatedly-transmits the coded bits.

If priority is given to both the first TFCI and the second TFCI, the transmitter performs coding by changing coding rates of the first TFCI and the second TFCI or considering the number of actual information bits, and then repeatedly-transmits the coded bits. It is possible to combine the coding rate changing method and the repeated transmission method.

Criterion 2: The number of first TFCI information bits or second TFCI information bits does not exceed 5 bits The transmitter encodes the first TFCI information bits and the second TFCI information bits using a (16,5) encoder before transmission.

Others are the same as Criteria 1

A code selecting method based on the above criteria, using the puncturing pattern of Table 5 and the coding rate of Table 1, will be described with reference to FIG. 12.

Figure 12:
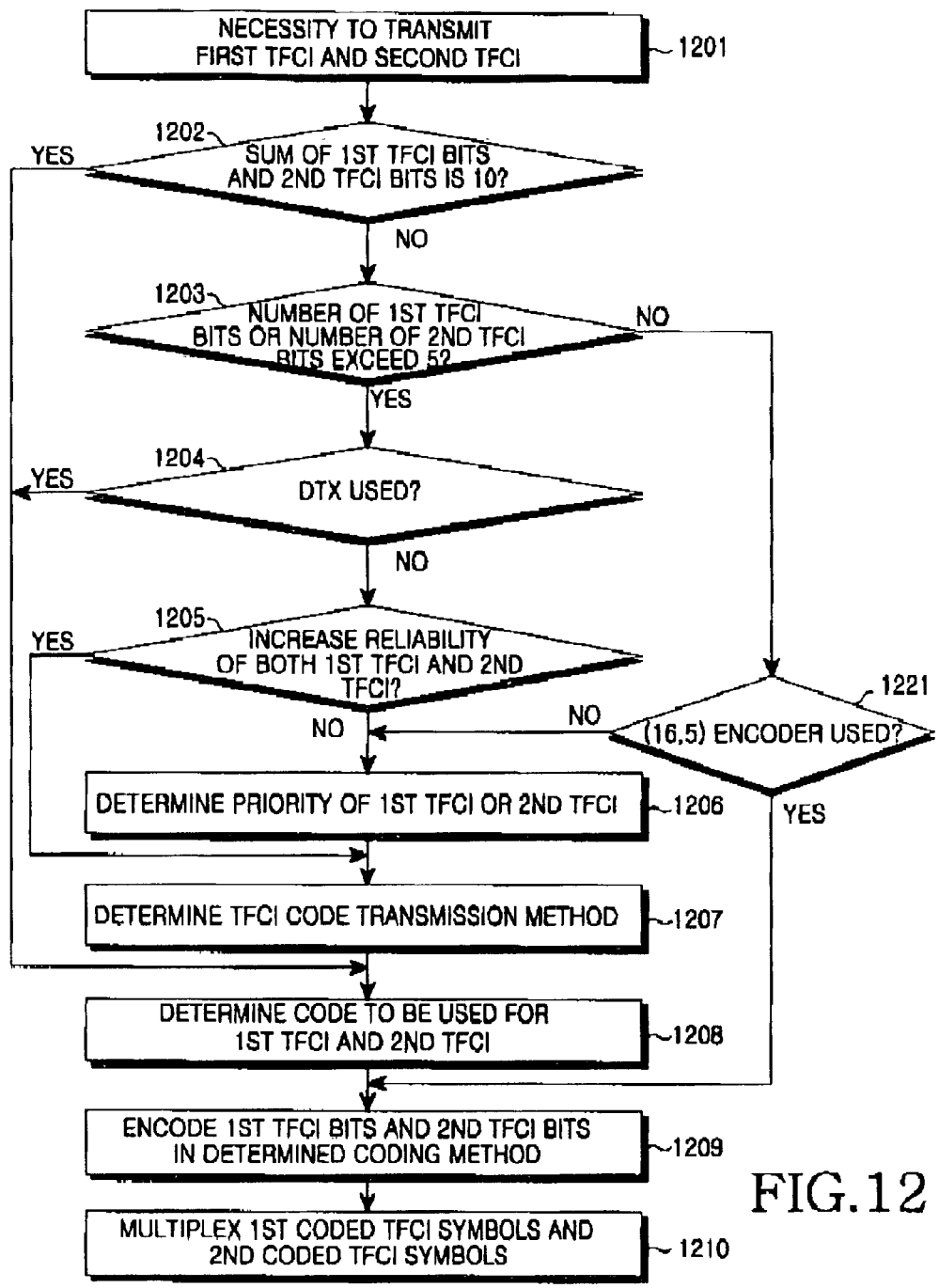
FIG. 12 illustrates a method of selecting codes to be used for first TFCI and second TFCI according to an embodiment of the present invention.

Referring to FIG. 12, necessity of transmitting the first TFCI (first information bits) and the second TFCI (second information bits) occurs in step 1201. That is, when a Node B is required to transmit DSCH to a UE, a transmitter receives the TFCI for the DSCH and the TFCI for the DCH. It is determined in step 1202 whether the sum of the first information bits and the second information bits is 10. If the sum of the first information bits and the second information bits is 10, the transmitter determines a code to be used for the first information bits and the second information bits in step 1208.

The code selecting process of step 1208 will be described when the ratio of the first information bits to the second information bits is 3:7. In this case, the encoder for the first information bits is a (9,3) encoder, a (10,3) encoder, or a (11,3) encoder, and the encoder for the second information bits is a (23,7) encoder, a (22,7) encoder or a (21,7) encoder. Here, the sum of the coded symbols should be 32. The criterion for selecting the 3 kinds of the coding rates according to the types of the information bits is to (1) give priority to the first information bits to add 2 surplus symbols, (2) give priority to the second information bits to add 2 surplus symbols, or (3) add one surplus symbol to both the first information bits and the second information bits. After determining the coding rate to be used for the first information bits and the second information bits in step 1208, the transmitter encodes the first information bits and the second information bits at the determined coding rate in step 1209. The transmitter multiplexes the first coded TFCI symbols and the second coded TFCI symbols in step 1210.

However, if it is determined in step 1202 that the sum of the first information bits and the second information bits is less than 10, the transmitter determines in step 1203 whether the number of the first information bits exceeds 5 or the number of the second information bits exceeds 5. If any of the number of the first information bits and the number of the second information bits exceeds 5, the transmitter proceeds to step 1204. However, if both the number of the first information bits and the number of the second information bits do not exceed 5, the transmitter proceeds to step 1221. In step 1221, the transmitter determines whether to use a (16,5) encoder in encoding the first information bits and the second information bits. When the transmitter determines not to use the (16,5) encoder, it proceeds to step 1206. Otherwise, the transmitter determines to use the (16,5) encoder, it proceeds to step 1209.

In step 1204, the transmitter determines whether to use DTX in transmitting the first information bits or the second information bits. When the transmitter determines to use DTX, it proceeds to step 1208. Otherwise, when the transmitter determines not to use DTX, it proceeds to step 1205.

The process of step 1208 will be described when the ratio of the first information bits to the second information bits is 3:4. In this case, the encoder for the first information bits is a selected one of a (9,3) encoder, a (10,3) encoder, and a (11,3) encoder, and the encoder for the second information bits is a selected one of a (12,4) encoder, a (13,4) encoder, and a (14,4) encoder. In step 1208, if the DTX is used when both the number of the first information bits and the number of the second information bits do not exceed 5, there is no restriction in selecting the encoders, but the sum of the coded symbols should not exceed 32.

In step 1205, the transmitter determines whether to increase reliability of performance of both the first TFCI and the second TFCI before transmission. If the transmitter determines to increase reliability or performance of both the first TFCI and the second TFCI before transmission, it selects one of the coding rate increasing method, the repeated transmission method, or the combined method of the above two methods, in step 1207. In step 1208, the transmitter determines the code to be used for the first TFCI and the second TFCI according to the method selected in step 1207. The transmitter encodes the first TFCI information bits and the second TFCI information bits in the selected method in step 1209, and then multiplexes the first coded TFCI symbols and the second coded TFCI symbols in step 1210. If the transmitter determines to increase the reliability or performance of the first TFCI and the second TFCI before transmission in the repeated transmission method in step 1207, the transmitter repeats the first coded TFCI symbols and the second coded TFCI symbols in step 1209, and then multiplexes them in step 1210. Alternatively, the transmitter repeats in step 1210 the first coded TFCI symbols and the second coded TFCI symbols, encoded in step 1209.

If the transmitter determines in step 1205 to increase reliability or performance of either the first TFCI or the second TFCI before transmission, the transmitter selects in step 1206 the first TFCI or the second TFCI, to which it will give priority. The transmitter gives priority to the first TFCI, when the first TFCI information bits should be transmitted at high reliability regardless of the number of the information bits. The transmitter gives priority to the second TFCI, when the second TFCI information bits should be transmitted at high reliability preparing for the case where Node Bs other than the Node B receiving DSCH cannot transmit the second TFCI information bits for the DSCH when the UE is located in the soft handover region. Also, the transmitter gives priority to the second TFCI, when the second TFCI information bits should be transmitted at high reliability regardless of the number of the information bits. If the transmitter determines to increase reliability or performance of either the first TFCI or the second TFCI before transmission in step 1206, the transmitter determines a method of increasing the reliability or performance of either the first TFCI or the second TFCI before transmission in step 1207, by utilizing the coding rate increasing method, the repeated transmission method or the combined method of the above two methods. In step 1208, the transmitter determines the code to be used for the first TFCI and the second TFCI according to the method determined in step 1207. The transmitter encodes the first TFCI information bits and the second TFCI information bits in the determined method in step 1209, and then multiplexes the first coded TFCI symbols and the second coded TFCI symbols in step 1210. If the transmitter determines to increase reliability or performance of either the first TFCI or the second TFCI in the coding rate increasing method in step 1207, the transmitter multiplexes in step 1210 the first coded TFCI symbols and the second coded TFCI symbols, encoded in step 1209. If the transmitter determines in step 1207 to increase the reliability or performance of either the first TFCI or the second TFCI before transmission in the repeated transmission method, the transmitter repeats the first coded TFCI symbols and the second coded TFCI symbols in step 1209, and then multiplexes them in step 1210. Alternatively, the transmitter repeats in step 1210 the first coded TFCI symbols and the second coded TFCI symbols, encoded in step 1209.

As described above, the embodiment of the present invention can encode/decode various types of the TFCI bits using a single encoder/decoder structure. In addition, the embodiment multiplexes the TFCI symbols encoded in the different coding techniques, such that the TFCI symbols should be uniformly distributed before being transmitted. For the 10 input information bits, the TFCI coding is performed in a selected one of the ratios of 1:9, 2:8, 3:7, 4:6, 5:5, 6:4, 7:3, 8:2, and 9:1 depending on the type and characteristic of the data transmitted over the DSCH and the DCH, thus contributing to flexibility of the HSM that is superior to the LSM in terms of signaling and time delay. In addition, the encoder encodes the TFCI bits for the DCH and the TFCI bits for the DSCH, and then stores the coded TFCI symbols for the DCH and the coded TFCI symbols for the DSCH in a storage device, thereby securing rapid information processing.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for mapping first coded TFCI (Transport Format Combination Indicator) symbols and second coded TFCI symbols to a radio frame in a transmission apparatus of a mobile communication system for encoding k first TFCI bits and (10−k) second TFCI bits, a sum of the first coded TFCI symbols and the second coded TFCI symbols being 32, the method comprising the steps of:
   multiplexing the first and second coded TFCI symbols such that the first coded TFCI symbols and the second coded TFCI symbols are uniformly distributed according to a transmission mode and a data rate of the radio frame, and outputting 32 coded symbols; and
   mapping the 32 multiplexed coded symbols to the radio frame to satisfy a number of the coded symbols that can be mapped to one radio frame, determined according to the transmission mode and the data rate of the radio frame.

2. The method of claim 1, wherein the first coded TFCI symbols are multiplexed in positions calculated by $$b_{\left[\frac{32}{n} \times (i+1)\right] - 1} = c_i^1, (0 \leq i \leq n-1)$$

where n represents a total number of the first coded TFCI symbols, and i represents an index indicating an arbitrary coded symbol among the first coded TFCI symbols.

3. The method of claim 1, wherein the second coded TFCI symbols are multiplexed in positions calculated by $$b_{i + \left\lfloor \frac{n}{32-n} \times (i + \frac{1}{2}) \right\rfloor} = c_i^2, (0 \leq i \leq m-1)$$

where n represents a total number of the first coded TFCI symbols, m represents a total number of the second coded TFCI symbols, and i indicates an index indicating an arbitrary coded symbol among the first coded TFCI symbols.

4. The method of claim 1, wherein if the number of coded symbols that can be mapped to one radio frame is 30, then 30 coded symbols excepting an arbitrary one of the first coded TFCI symbols and an arbitrary one of the second coded TFCI symbols are mapped to the radio frame.

5. The method of claim 4, wherein the arbitrary one of the first coded TFCI symbols is a last coded symbol of the first coded TFCI symbols, and the arbitrary one of the second coded TFCI symbols is a last coded symbol of the second coded TFCI symbols.

6. The method of claim 1, wherein if the number of coded symbols that can be mapped to one radio frame is 30, then 30 coded symbols excepting two arbitrary coded symbols among the first coded TFCI symbols or two arbitrary coded symbols among the second coded TFCI symbols are mapped to the radio frame.

7. The method of claim 1, wherein if the number of coded symbols that can be mapped to one radio frame is 120, the 32 multiplexed coded symbols are repeated 3 times, first 24 coded symbols among the 32 multiplexed coded symbols are further repeated, and then mapped to the radio frame.

8. The method of claim 1, wherein if the number of coded symbols that can be mapped to one radio frame is 32, the 32 multiplexed coded symbols are mapped to the radio frame.

9. The method of claim 1, wherein if the number of coded symbols that can be mapped to one radio frame is 128, the 32 multiplexed coded symbols are repeated 4 times and then mapped to the radio frame.

10. An apparatus for transmitting first TFCI (Transport Format Combination Indicator) bits and second TFCI bits over a radio frame in a transmission apparatus of a mobile communication system, comprising:
   at least one encoder for encoding k first TFCI bits at a first coding rate to output (3k+1) first coded TFCI symbols, and encoding (10−k) second TFCI bits at a second coding rate to output (31−3k) second coded TFCI symbols; and
   a coded symbol arranger for multiplexing the coded symbols such that the first coded TFCI symbols and the second coded TFCI symbols are uniformly distributed according to a transmission mode and a data rate of the radio frame, and outputting the multiplexed coded symbols according to a number of coded symbols that can be transmitted over one radio frame.

11. The apparatus of claim 10, further comprising a selector for selecting the first TFCI bits and the second TFCI bits according to a value of k, and providing the selected TFCI bits to the encoder.

12. The apparatus of claim 10, wherein the coded symbol arranger multiplexes the coded symbols such that the first coded TFCI symbols are output in positions calculated by $$b_{\left[\frac{32}{n} \times (i+1)\right] - 1} = c_i^1, (0 \leq i \leq n-1)$$

where n represents a total number of the first coded TFCI symbols, and i represents an index indicating an arbitrary coded symbol among the first coded TFCI symbols.

13. The apparatus of claim 10, wherein the coded symbol arranger multiplexes the coded symbols such that the second coded TFCI symbols are output in positions calculated by $$b_{i + \left\lfloor \frac{n}{32-n} \times (i + \frac{1}{2}) \right\rfloor} = c_i^2, (0 \leq i \leq m-1)$$

where n represents a total number of the first coded TFCI symbols, m represents a total number of the second coded TFCI symbols, and i indicates an index indicating an arbitrary coded symbol among the first coded TFCI symbols.

14. A method for transmitting first TFCI (Transport Format Combination Indicator) bits and second TFCI bits over a radio frame in a transmission apparatus of a mobile communication system, comprising the steps of:
   encoding k first TFCI bits at a first coding rate to output (3k+1) first coded TFCI symbols;
   encoding (10−k) second TFCI bits at a second coding rate to output (31−3k) second coded TFCI symbols;
   multiplexing the first and second coded TFCI symbols such that the first coded TFCI symbols and the second coded TFCI symbols are uniformly distributed according to a transmission mode and a data rate of the radio frame; and
   outputting the multiplexed coded symbols according to a number of coded symbols that can be transmitted over one radio frame.

15. The method of claim 14, wherein the first coded TFCI symbols are output in positions calculated by $$b_{[\frac{32}{n}\times(i+1)]-1} = c_i^1, (0 \leq i \leq n-1)$$

where n represents a total number of the first coded TFCI symbols, and i represents an index indicating an arbitrary coded symbol among the first coded TFCI symbols.

16. The method of claim 14, wherein the second coded TFCI symbols output in positions calculated by $$b_{\lfloor \frac{n}{32-n}\times(i+\frac{1}{2})\rfloor} = c_i^2, (0 \leq i \leq m-1)$$

where n represents a total number of the first coded TFCI symbols, m represents a total number of the second coded TFCI symbols, and i indicates an index indicating an arbitrary coded symbol among the first coded TFCI symbols.

17. An apparatus for decoding k first TFCI bits and (10−k) second TFCI bits in a reception apparatus of a mobile communication system for receiving (3k−1) first coded TFCI symbols for a DCH (Dedicated Channel) and (31−3k) second coded TFCI symbols for a DSCH (Downlink Shared Channel), comprising:
  a coded symbol rearranger for separating the first coded TFCI symbols and the second coded TFCI symbols, transmitted over a DPCH (Dedicated Physical Channel), according to a value of k, for rearrangement; and
  at least one decoder for decoding the first coded TFCI symbols to output the k first TFCI bits, and decoding the second coded TFCI symbols to output the (10−k) second TFCI bits.

18. The apparatus of claim 17, wherein the coded symbol rearranger separates the first coded TFCI symbols existing in positions calculated by the following formula from coded symbols obtained by multiplexing the first coded TFCI symbols and the second coded TFCI symbols:

$$b_{[\frac{32}{n}\times(i+1)]-1} = c_i^1, (0 \leq i \leq n-1)$$

where n represents a total number of the first coded TFCI symbols, and i represents an index indicating an arbitrary coded symbol among the first coded TFCI symbols.

19. The apparatus of claim 17, wherein the coded symbol rearranger separates the second coded TFCI symbols existing in positions calculated by the following formula from coded symbols obtained by multiplexing the first coded TFCI symbols and the second coded TFCI symbols:

$$b_{i+\lfloor \frac{n}{32-n}\times(i+\frac{1}{2})\rfloor} = c_i^2, (0 \leq i \leq m-1)$$

where n represents a total number of the first coded TFCI symbols, m represents a total number of the second coded TFCI symbols, and i indicates an index indicating an arbitrary coded symbol among the first coded TFCI symbols.

20. A method for decoding k first TFCI bits and (10−k) second TFCI bits in a reception apparatus of a mobile communication system for receiving (3k−1) first coded TFCI symbols for a DCH (Dedicated Channel) and (31−3k) second coded TFCI symbols for a DSCH (Downlink Shared Channel), comprising the steps of:
  separating the first coded TFCI symbols and the second coded TFCI symbols, transmitted over a DPCH (Dedicated Physical Channel), according to a value of k, for rearrangement;
  decoding the first coded TFCI symbols to output the k first TFCI bits; and
  decoding the second coded TFCI symbols to output the (10−k) second TFCI bits.

21. The method of claim 20, wherein the first coded TFCI symbols existing in positions calculated by the following formula are separated from coded symbols obtained by multiplexing the first coded TFCI symbols and the second coded TFCI symbols:

$$b_{[\frac{32}{n}\times(i+1)]-1} = c_i^1, (0 \leq i \leq n-1)$$

where n represents a total number of the first coded TFCI symbols, and i represents an index indicating an arbitrary coded symbol among the first coded TFCI symbols.

22. The method of claim 20, wherein the second coded TFCI symbols existing in positions calculated by the following formula are separated from coded symbols obtained by multiplexing the first coded TFCI symbols and the second coded TFCI symbols:

$$b_{i+\lfloor \frac{n}{32-n}\times(i+\frac{1}{2})\rfloor} = c_i^2, (0 \leq i \leq m-1)$$

where n represents a total number of the first coded TFCI symbols, m represents a total number of the second coded TFCI symbols, and i indicates an index indicating an arbitrary coded symbol among the first coded TFCI symbols.

* * * * *